(12) United States Patent
Tran et al.

(10) Patent No.: US 7,825,698 B2
(45) Date of Patent: Nov. 2, 2010

(54) METHOD AND APPARATUS FOR SYSTEMATIC AND RANDOM VARIATION AND MISMATCH COMPENSATION FOR MULTILEVEL FLASH MEMORY OPERATION

(75) Inventors: Hieu Van Tran, San Jose, CA (US); Hung Quoc Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 12/131,008

(22) Filed: May 30, 2008

(65) Prior Publication Data
US 2008/0224774 A1    Sep. 18, 2008

Related U.S. Application Data

(62) Division of application No. 11/235,894, filed on Sep. 26, 2005, now Pat. No. 7,405,988.

(51) Int. Cl.
*G01R 19/00* (2006.01)

(52) U.S. Cl. .......................................... 327/52; 327/50
(58) Field of Classification Search .............. 327/50–56
See application file for complete search history.

(56) References Cited

U.S. PATENT DOCUMENTS

| | | | |
|---|---|---|---|
| 5,012,450 A * | 4/1991 | Mattausch et al. .......... 365/208 |
| 5,646,900 A | 7/1997 | Tsukude et al. | |
| 6,097,641 A | 8/2000 | Lu et al. | |
| 6,144,218 A * | 11/2000 | Smith et al. .................... 326/32 |
| 6,282,145 B1 | 8/2001 | Tran et al. | |
| 6,625,057 B2 | 9/2003 | Iwata | |
| 7,183,555 B2 | 2/2007 | Jarron | |
| 7,394,708 B1 * | 7/2008 | Vadi ............................ 365/201 |
| 2002/0015347 A1 * | 2/2002 | Kitamoto ..................... 365/226 |
| 2002/0089024 A1 | 7/2002 | Iwata | |
| 2002/0094697 A1 | 7/2002 | Leung et al. | |
| 2002/0167340 A1 * | 11/2002 | Bruneau et al. ................ 327/52 |
| 2003/0103406 A1 | 6/2003 | Tran | |
| 2003/0151072 A1 | 8/2003 | Leung et al. | |
| 2004/0114436 A1 | 6/2004 | Hecht et al. | |
| 2004/0190329 A1 | 9/2004 | Namekawa et al. | |
| 2005/0206642 A1 * | 9/2005 | Kushima et al. ............. 345/211 |

FOREIGN PATENT DOCUMENTS

EP    740307 A1    10/1996

* cited by examiner

*Primary Examiner*—Lincoln Donovan
*Assistant Examiner*—Ryan C Jager
(74) *Attorney, Agent, or Firm*—DLA Piper LLP (US)

(57) ABSTRACT

Method and means for random or systematic mismatch compensation for a memory sensing system are disclosed. A sense amplifier includes a bulk voltage source to set the bulk of the sensing transistor to be a voltage different than the voltage driving the sensing transistor. For an NMOS sensing transistor, a triple well is used with the variable bulk voltage. Differential sense amplifiers with various offset compensation are included. Intentional offset creation for useful purpose is also included.

3 Claims, 18 Drawing Sheets

METHOD AND APPARATUS FOR SYSTEMATIC AND RANDOM VARIATION AND MISMATCH COMPENSATION FOR MULTILEVEL FLASH MEMORY OPERATION

RELATED APPLICATIONS

This application is a divisional of U.S. patent application Ser. No. 11/235,894 filed Sep. 26, 2005, which is incorporated herein by this reference.

FIELD OF THE INVENTION

The present invention relates to sense amplifiers and, more particularly, relates to sense amplifiers that compensate for variations and mismatches in a memory circuit.

BACKGROUND OF THE INVENTION

As information technology progresses at an unprecedented pace, the need for information storage increases proportionately. Accordingly, the non volatile information in stationary or portable communication demands higher capability and capacity storage. One approach to increasing the amount of storage is by decreasing physical dimensions of the stored bit (e.g., memory cell) to smaller dimensions such as nanocell technology. Another approach is to increase the storage density per bit. The second approach is known as digital multilevel nonvolatile storage technology. A sense amplifier reads the content of a memory cell by comparison to reference levels. As more bits are stored in a multilevel memory cell, the voltage separation of reference levels decreases. Systematic and random variation and mismatch in a sense amplifier may change data or reference levels to cause erroneous detection of the content of a memory cell.

SUMMARY OF THE INVENTION

The present invention provides a sense amplifier that may include well voltage compensation of transistors therein. It also includes other compensation methods and means.

DETAILED DESCRIPTION

A memory system that compensates for systematic and random variation and mismatch in a memory, such as flash memory, is described. The compensation may minimize output variation between output levels for reference and data cells for various cell levels across a memory array. The compensation may include threshold voltage modulation, data trimming, or voltage shifting, or combinations thereof. Ratio tuning or margining may be achieved using similar compensation. Further, the programming and erase levels may be similarly compensated. The memory system may include a differential amplifier with modulation of well voltage of an input pair or well voltage of an output, and may include well voltage tracking with common mode input voltage. An offset may be created, such as offset addition or subtraction, for margining, level speed up, supply voltage VDD and temperature compensation, decoding compensation, or systematic compensation.

Figure 1:
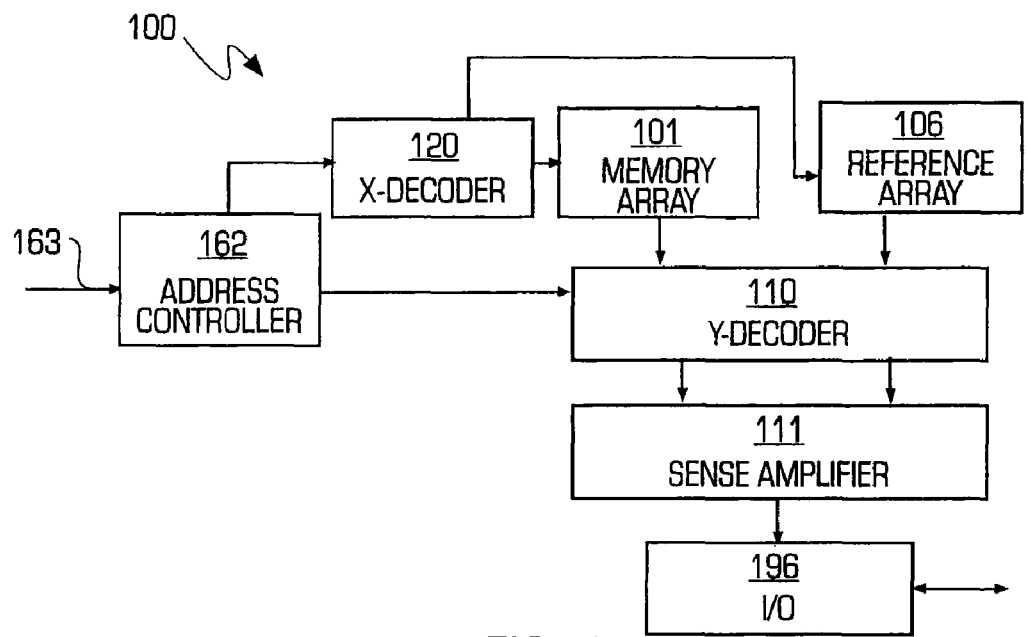
FIG. 1 is a block diagram illustrating a digital multilevel bit memory system.

FIG. 1 is a block diagram illustrating a digital multilevel bit memory array system 100.

The digital multilevel bit memory array system 100 includes a memory array 101 that includes a plurality of memory cells (not shown) and a reference array 106 that includes a plurality of reference memory cells (not shown). An N bit digital multilevel cell is defined as a memory cell capable of storing the $2^N$ levels. The reference array 106 is used as a reference system of reference voltage levels to verify the contents of the memory array 101. In another embodiment, the memory array 101 may include reference memory cells for storing the reference voltage levels.

In one embodiment, the memory array 101 and the reference array 106 include a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The multilevel memory cells of the memory array 101 may be arranged in various ways, such as in rows and columns or in segments. Various addressing schemes may be used which organize the memory cells into bytes, pages or other arrangements.

The digital multilevel bit memory array system 100 further includes an x decoder 120, a y decoder 110, an address controller 162, a sense amplifier circuit 111, and an intelligent input/output interface 196. The y decoder 110 controls bitlines (not shown) coupled to columns in memory cells and the reference voltage cells, during a write, read (or verify), and erase operations. The sense amplifier 111 senses the read data which is provided to the I/O interface 196. The I/O interface 196 also buffers input into the memory array system 100. The sense amplifier 111 also senses the read data and verifies the read data against input data during memory programming or erasing.

In response to an address signal 163 and other control signals (not shown), the address controller 162 decodes the address signal 163 and controls page, byte, segment or other addressing for the x decoder 120 and the y decoder 110. The x decoder 120 selects a row or a block of rows in the arrays 101 and 106 based on the signals from the address controller 162 and provides precise multilevel bias values over temperature, process, and power supply used for consistent single level or multilevel memory operation for the memory array 101.

The system 100 includes power related circuits (not shown), such as band gap voltage generators, charge pumps, voltage regulators, and power management systems, and other control circuits (not shown) such as voltage algorithm controllers.

The system 100 may execute various operations on the memory array 101. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Figure 2:
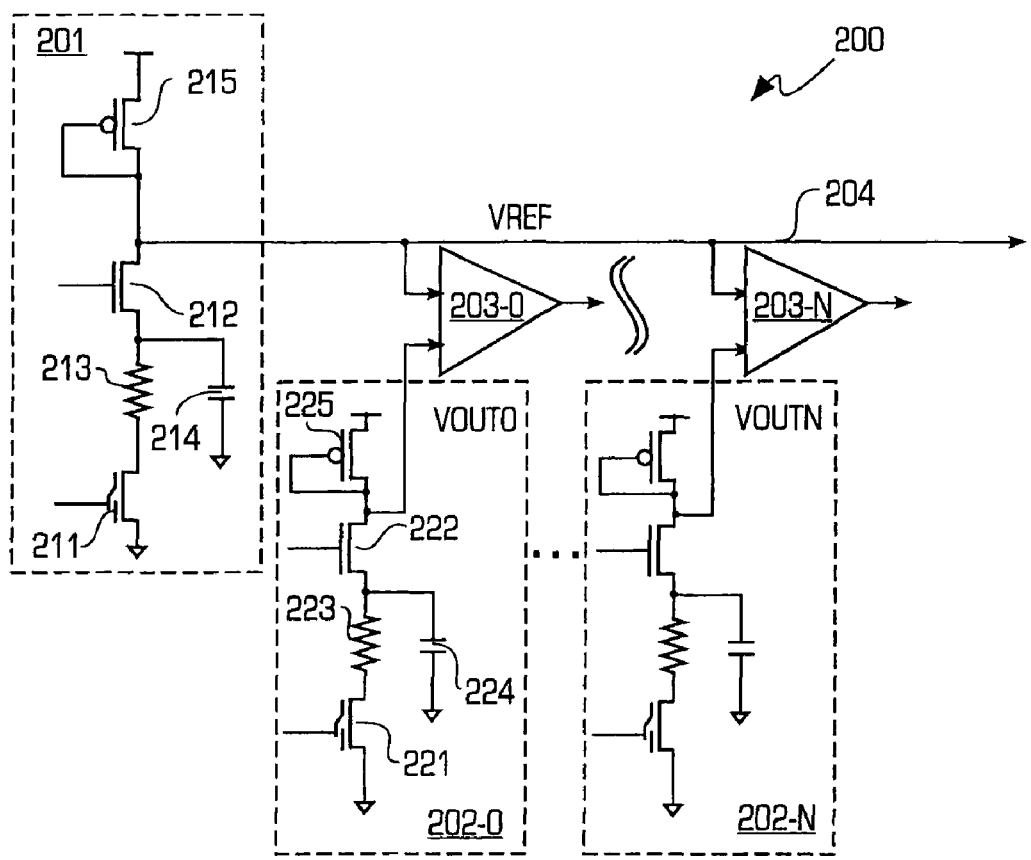
FIG. 2 is a schematic diagram illustrating a conventional sensing system.

FIG. 2 is a schematic diagram illustrating a conventional sensing system 200.

The conventional sensing system 200 comprises a reference column 201, a plurality of data columns 202-0 through 202-N, and a plurality of comparators 203-0 through 203-N. The reference column 201 comprises a reference memory cell 211, an NMOS transistor 212 and a PMOS transistor 215. A bitline resistor 213 is shown to indicate resistance on the bitline. A bitline capacitor 214 is shown to indicate capacitance on the bitline. The reference column 201 provides a voltage reference on the reference line 204 which is applied to a first input of each of the comparators 203-0 through 203-N. Each data column 202 comprises a data memory cell 221, an NMOS transistor 222 and a PMOS transistor 225. A bitline resistor 223 is shown to indicate resistance on the bitline. A bitline capacitor 224 is shown to indicate capacitance on the bitline. Each of the data columns 202-0 through 202-N provides a data output voltage to a second input of a respective comparator 203-0 through 203-N so that the comparator 203 provides an output indicative of the stored data in the corresponding data column 202.

The conventional sensing system 200 has mismatches within the system because of differences in the PMOS transistors 215 and 225 that provide loads for the respective reference column 201 and the data column 202. Further, the comparators 203 have a mismatch in their inputs. These mismatches may lead to inaccurate reads of the data cells 221. Moreover, the bitlines may have a mismatch in capacitances that may lead to inaccurate reads, especially in dynamic reads. Other mismatches may come from layout, such as voltage drop along power lines or interconnect lines.

The mismatches may cause a difference dVo in voltage between outputs of the comparators 203 due to the PMOS transistors mismatch of the threshold voltage VT, beta mismatch, or voltage drop mismatch, such as VDD, bias current Ibias, or voltage bias Vbias. The difference voltage dVo is typically between 20 and 50 millivolts.

The sense amplifier 111 (FIG. 1) may include the sensing systems of differential amplifiers, bulk voltage generators and control systems of FIGS. 3-38.

Figure 3:
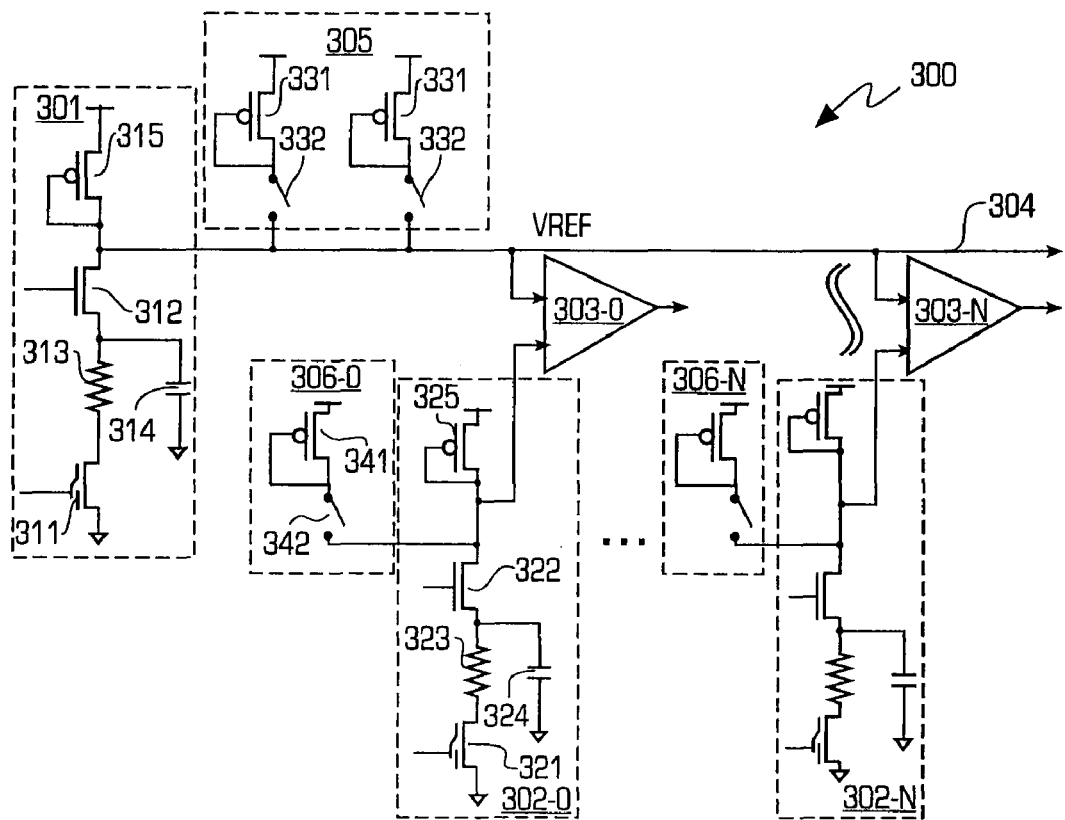
FIG. 3 is a schematic diagram illustrating a first embodiment of a sensing system of the digital multilevel bit memory system of FIG. 1.

FIG. 3 is a schematic diagram illustrating a sensing system 300.

The sensing system 300 uses selectable loading on bitlines for sensing reference cells and data cells. The sensing system 300 comprises a reference column 301, a plurality of data columns 302-0-302-N, a plurality of comparators 303-0-303-N, and a plurality of load circuits 305 and 306-0-306-N. The reference column 301 comprises a reference memory cell 311, an NMOS transistor 312 and a diode connected PMOS transistor 315. A bitline resistor 313 is shown to indicate resistance on the bitline. A bitline capacitor 314 is shown to indicate capacitance on the bitline. The reference column 301 provides a voltage reference on a reference line 304, which is applied to a first input of each of the comparators 303-0-303-N. Each data column 302 comprises a data memory cell 321, an NMOS transistor 322 and a diode connected PMOS transistor 325. A bitline resistor 323 is shown to indicate resistance on the bitline. A bitline capacitor 324 is shown to indicate capacitance on the bitline. Each of the data columns 302-0-302-N provides a data output voltage to a second input of a respective comparator 303-0-303-N so that the comparator 303 provides an output indicative of the stored data in the corresponding data column 302 relative to the reference voltage from the reference column 301. The load circuit 305 comprises a plurality of diode connected PMOS transistors 331 and a plurality of switches 332. The switches 332 selectively couple a corresponding one of the diode connected PMOS transistors 331 to the reference line 304 to further load the reference memory cell 311 during a sensing mode. Each of the load circuits 306 comprises plurality of diode connected PMOS transistors 341 and a plurality of switches 342 (only one is shown for clarity). The switch 342 selectively couples the diode connected PMOS transistor 341 to the drain of the diode connected PMOS transistor 325 to load the data memory cell 321 during sensing. Although one transistor 341 is shown in the load circuit 306, other numbers of transistors may be used for loading the data memory cell 321. Each load circuit 306 has its own individually selectable switches to compensate for its own mismatches.

The load circuit 305 and 306 provide loads for offsetting errors in the memory array, but the loading impacts the reading speed and requires additional enabling lines. Further, the load circuits may not provide perfect cancellation of mismatches, such as for threshold voltage mismatch compensation.

Figure 4:
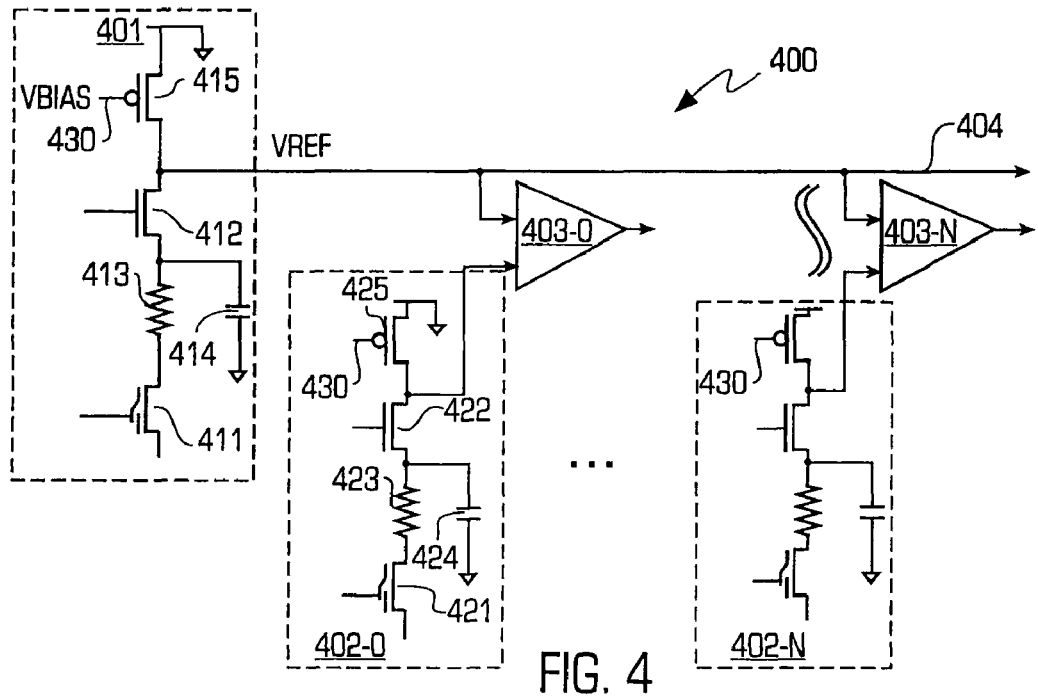
FIG. 4 is a schematic diagram illustrating a second embodiment of a sensing system of the digital multilevel bit memory system of FIG. 1.

FIG. 4 is a schematic diagram illustrating a sensing system 400.

The sensing system 400 uses auto zero to adjust offsets in real time. (The sensing system 400 is shown in a voltage sensing mode, but may be applied to a current sensing mode.) The sensing system 400 comprises a reference column 401, a plurality of data columns 402-0 through 402-N, and a plurality of comparators 403-0 through 403-N. The reference column 401 comprises a reference memory cell 411, an NMOS transistor 412, and a biased NMOS transistor 415 biased by a voltage VBIAS 430. A bitline resistor 413 is shown to indicate resistance on the bitline. A bitline capacitor 414 is shown to indicate capacitance on the bitline. The reference column 401 provides a voltage reference on a reference line 404, which is applied to a first input of each of the comparators 403-0 through 403-N. Each of the data columns 402-0 through 402-N provides a data output voltage to a second input of a respective comparator 403-0 through 403-N so that the comparator 403 provides an output indicative of the stored data in the corresponding data column 402 relative to the reference voltage from the reference column 401. Each data column 402 comprises a data memory cell 421, an NMOS transistor 422, and a biased NMOS transistor 425. A bitline resistor 423 is shown to indicate resistance on the bitline. A bitline capacitor 424 is shown to indicate capacitance on the bitline. The NMOS transistor 425 is biased by the bias voltage 430.

The comparators 403 include auto-zero. Although the sensing system 400 provides auto zero offset in real time, the system may use additional timing for offset settling, which may be in the order of a few millivolts. Examples of auto zero circuits are disclosed in co-pending published U.S. Patent Application No. US 2003/0103406 A1, published Jun. 5, 2003, the contents of which are incorporated herein by reference.

Figure 5:
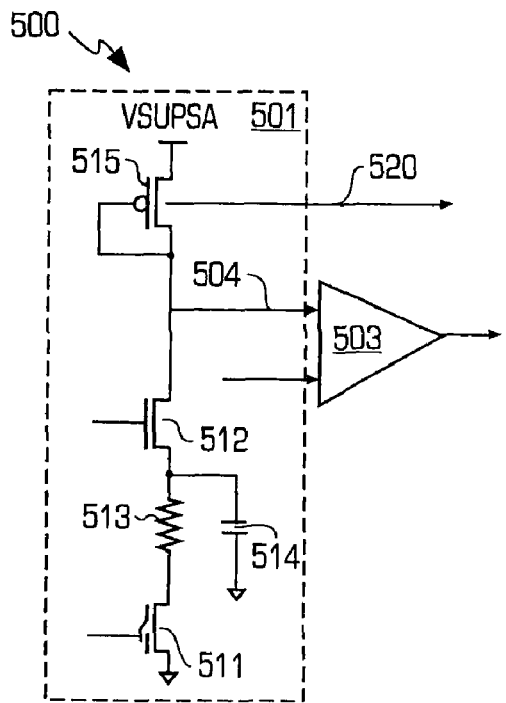
FIG. 5 is a schematic diagram illustrating a third embodiment of a sensing system of the digital multilevel bit memory system of FIG. 1.

FIG. 5 is a schematic diagram illustrating a sensing system 500.

The sensing system 500 comprises a reference column 501 and a comparator 503. The reference column 501 comprises a reference memory cell 511, a NMOS transistor 512 and a diode connected PMOS transistor 515. The NMOS transistor 512 selectively couples the reference memory cell 511 to a sense line 504, which is coupled to the comparator 503. The NMOS transistor 512 may be a CMOS transistor. A bitline resistor 513 is shown to indicate resistance on the bitline. A bitline capacitor 514 is shown to indicate capacitance on the bitline.

The source of the diode connected PMOS transistor 515 is coupled to a supply voltage VSUPSA, which may be different than a supply voltage applied to the memory system 100 (FIG. 1). The bulk of the PMOS transistor 505 is biased by an adjustable voltage applied to a bulk terminal 520, which may be a voltage that is different or less than the sense amplifier supply voltage VSUPSA. The bulk voltage may be provided by a voltage source such as described in conjunction with FIGS. 6-7. In one embodiment, the supply voltage minus the well voltage is less than the voltage of a pn junction (VDD-VWELL<V-pn) to avoid forward biasing the junction.

In illustrative embodiments of FIG. 5 and the following FIGS. 8, 10 11, 15-17, and 19, described below, the bulk voltage VBS may be used to change the threshold voltage VT, for example, at a rate dVT/dVBS=0.1V/0.2V. The dVT Range may be approximately 0.3V for a pn junction voltage V-pn of 0.6V.

In another embodiment, an NMOS pull-up load (such as its source connected to ground) with a PWELL may be used, such as in a triple well process. The PWELL voltage level (e.g., <VDD-VTN) may be modulated to change the threshold voltage VT.

For an NWell embodiment, the voltage on the NWell may be set greater than the supply voltage, e.g., by using a charge pump. The voltage of the NWell may be set greater than the source voltage of a pull-up PMOS transistor (for example, by regulating down source voltage of the PMOS transistor).

Figure 6:
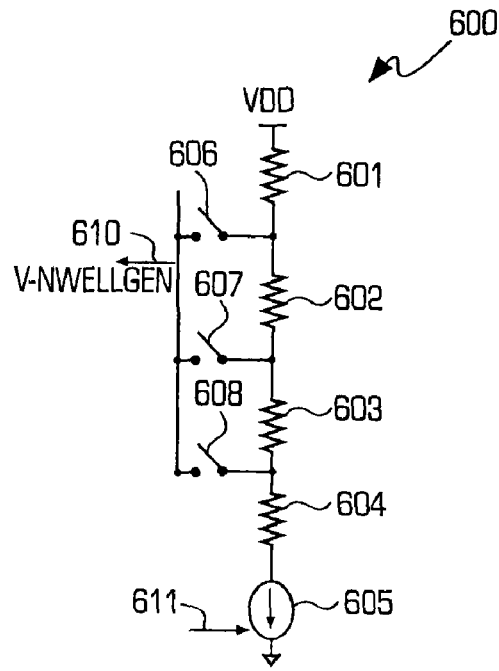
FIG. 6 is a schematic diagram illustrating a first embodiment of a bulk voltage generator of a sensing system of the digital multilevel bit memory system of FIG. 1.

FIG. 6 is a schematic diagram illustrating a bulk voltage generator 600.

The bulk voltage generator 600 generates an adjustable bulk voltage in response to selectable resistor tapping or bias current modulation. The bulk voltage generator 600 comprises a plurality of resistors 601-604, a current source 605, and a plurality of switches 606-608. The resistor 601, 602, 603, 604 and the current source 605 are coupled in series between a voltage supply VDD and ground. Although four resistors are shown in FIG. 6, other numbers of resistors may be used. The current source 605 generates a bias current in response to digital to analog conversion of a digital selection signal 611. The plurality of switches 606, 607, 608 selectively couple nodes between the resistors, which are arranged as the voltage divider, to an output node 610. The output node 610 may be coupled to the bulk terminal 520 of the diode connected transistor 515 (FIG. 5).

Figure 7:
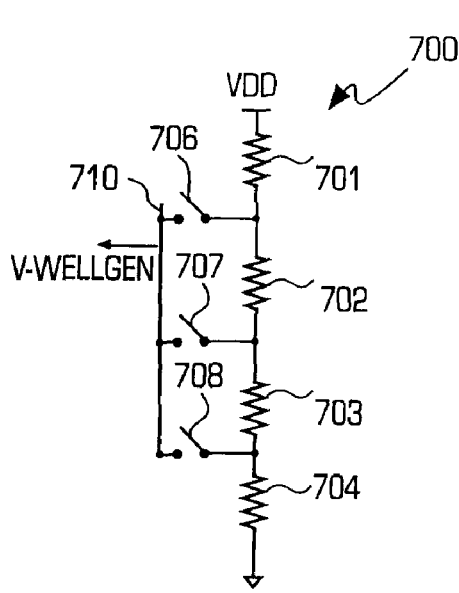
FIG. 7 is a schematic diagram illustrating a second embodiment of a bulk voltage generator of a sensing system of the digital multilevel bit memory system of FIG. 1.

FIG. 7 is a schematic diagram illustrating a bulk voltage generator 700.

The bulk voltage generator 700 generates an adjustable well-bias voltage in response to selectable resistor tapping. The voltage level may be set so that the voltage difference VDD minus VWELL is less than the V-PN junction voltage to avoid forward biasing the junction. The bulk voltage generator 700 comprises a plurality of resistors 701 through 704, which are coupled in series as a voltage divider between a voltage supply VDD and ground. Although four resistors are shown in FIG. 7, other numbers of resistors may be used. The bulk voltage generator 700 further comprises a plurality of switches 706, 707 and 708, which selectively couple nodes between the resistors 701, 702, 703 and 704, to an output node 710. The output node 710 may be coupled to the bulk terminal 520 of the diode connected transistor 515 (FIG. 5).

Figure 8:
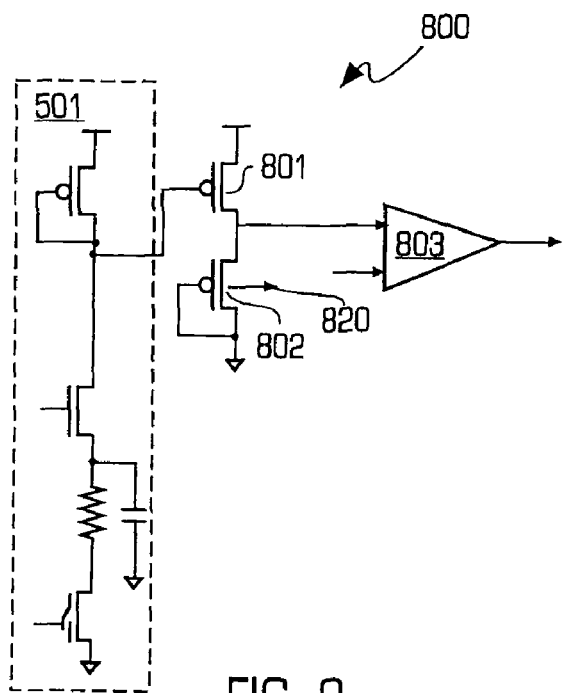
FIG. 8 is a schematic diagram illustrating a fourth embodiment of a sensing system of the digital multilevel bit memory system of FIG. 1.

FIG. 8 is a schematic diagram illustrating a sensing system 800.

The sensing system 800 comprises a reference column 501, a plurality of PMOS transistors 801 and 802, and a comparator 803. The PMOS transistors 801 and 802 are arranged as a buffer stage and provide a load of a current mirror of the current sensed in the reference column 501. A bulk terminal 820 provides a bulk voltage to the PMOS transistor 802. The bulk voltage may be provided by a voltage source, such as described below in conjunction with FIG. 9.

In illustrative embodiments of FIG. 8 and FIG. 10, described below, the bulk substrate voltage VBS is used to change the PMOS threshold voltage VTP to be greater than approximately 1.5 volts.

Figure 9:
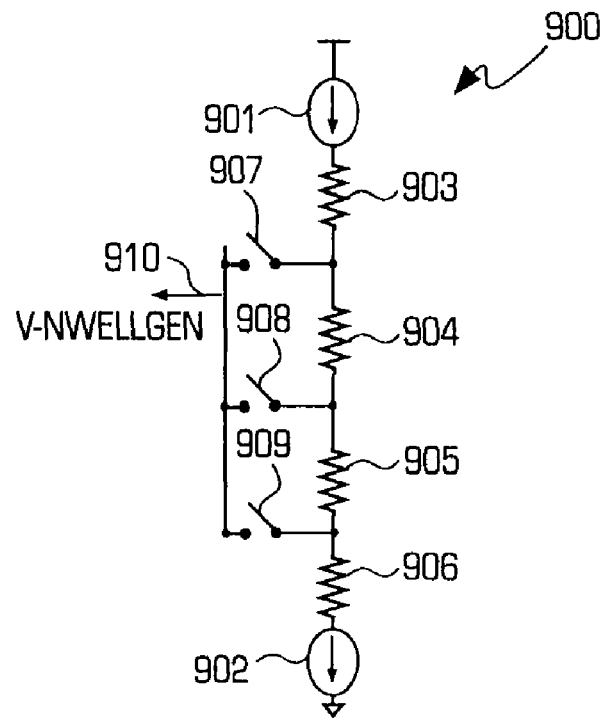
FIG. 9 is a schematic diagram illustrating a third embodiment of a bulk voltage generator of a sensing system of the digital multilevel bit memory system of FIG. 1.

FIG. 9 is a schematic diagram illustrating a bulk voltage generator 900.

The bulk voltage generator 900 generates an adjustable bulk voltage in response to selectable resistor tapping or bias current modulation. The bulk voltage generator 900 comprises a plurality of current sources 901 and 902, a plurality of resistors 903 through 906, and a plurality of switches 907 through 909. The resistors 903 through 906 are coupled in series as a voltage divider between the current sources 901 and 902. In one embodiment, the current sources 901 and 902 may generate fixed voltages. In another embodiment, one or both of the current sources 901 and 902 may generate adjustable current in response to a selection signal (not shown in FIG. 9). Although four resistors are shown in FIG. 9, other numbers of resistors may be used. The switches 907, 908, 909 selectively couple nodes between the resistors 903, 904, 905 and 906 to an output node 910. The output node 910 may be coupled to the bulk terminal of the diode connected PMOS transistor 802 (FIG. 8).

Figure 10:
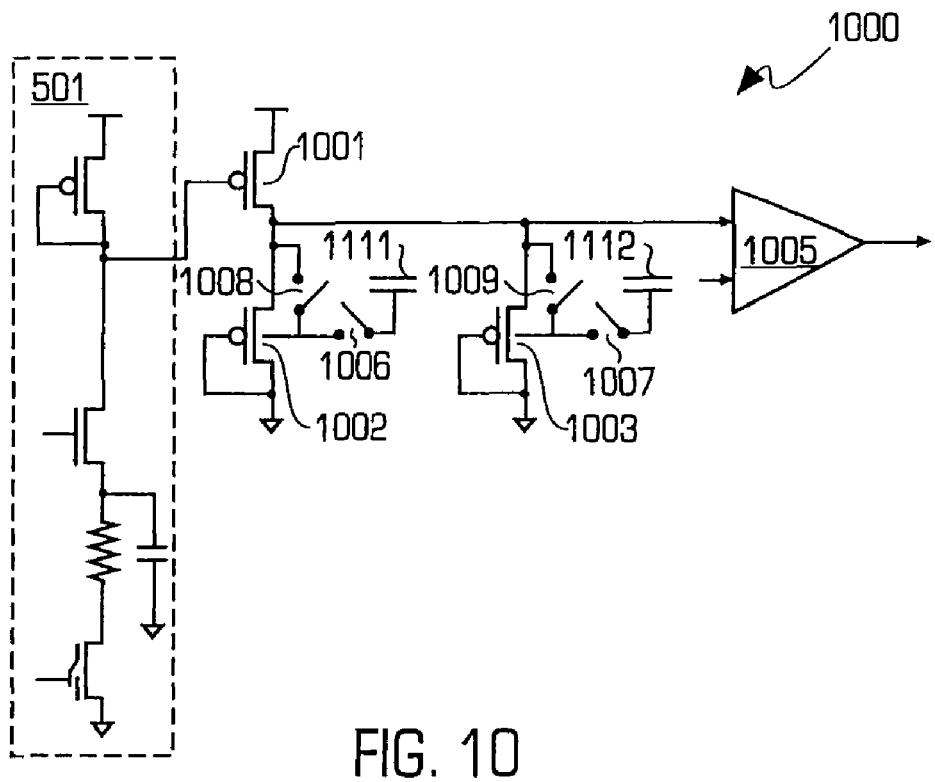
FIG. 10 is a schematic diagram illustrating a fifth embodiment of a sensing system of the digital multilevel bit memory system of FIG. 1.

FIG. 10 is a schematic diagram illustrating a sensing system 1000.

The sensing system 1000 comprises a reference column 501, a plurality of PMOS transistors 1001, 1002 and 1003, a comparator 1005, and a plurality of switches 1006, 1007, 1008, and 1009. The PMOS transistors 1001, 1002 and 1003 are arranged as a buffer and provide a load of a current mirror of the current sensed in the reference column 501. The switches 1106 and 1108 selectively couple the bulk of the PMOS transistor 1002 to a voltage supply terminal 1111 and the source of the PMOS transistor 1002, respectively. The switches 1007 and 1009 selectively couple the bulk of the PMOS transistor 1003 to a voltage supply terminal 1112 and the source of the PMOS transistor 1003, respectively. The bulk substrate voltage VBS may be used to change the PMOS voltage threshold VTP to be greater than about 1.5 volts. The switches 1006 and 1008 are used to cause the bulk substrate voltage to switch the PMOS transistor 1002 on and off. The switches 1007 and 1009 are used to cause the bulk substrate voltage to switch PMOS transistors 1003 on and off.

Figure 11:
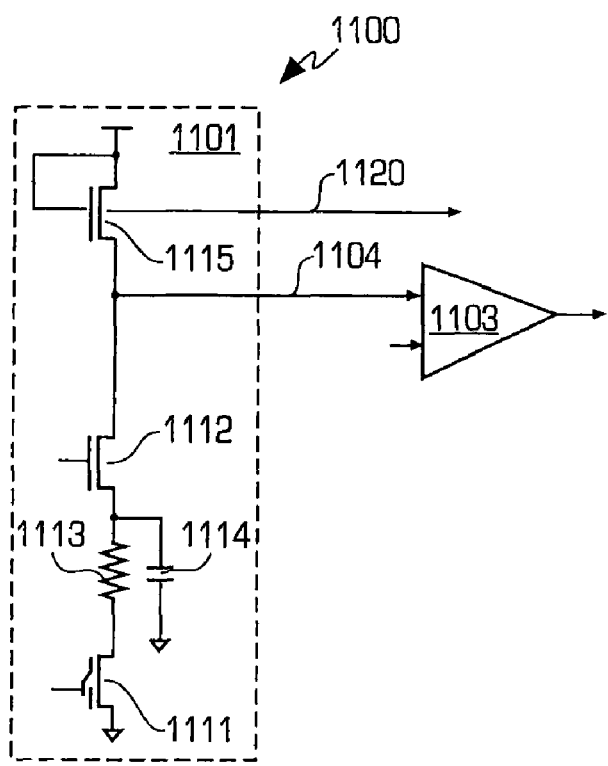
FIG. 11 is a schematic diagram illustrating a sixth embodiment of a sensing system of the digital multilevel bit memory system of FIG. 1.

FIG. 11 is a schematic diagram illustrating a sensing system 1100.

The sensing system 1100 comprises a reference column 1101 and a comparator 1103. The reference column 1101 comprises a reference memory cell 1111, and an enable switch 1112 and a diode connected NMOS transistor 1115. The switch 1112 selectively couples the reference memory cell 1111 to a sense line 1104, which is coupled to the comparator 1103. The switch 1112 may be an NMOS transistor. The bitline resistor 1113 is shown to indicate resistance on the bitline. A bitline capacitor 514 is shown to indicate capacitance on the bitline. The bulk of the diode connected NMOS transistor 1115 is biased by an adjustable voltage applied to a bulk terminal 1120, which may be a voltage that is different or less than the sense amplifier supply voltage. The bulk voltage may be provided by a voltage source, such as described in conjunction with FIGS. 6-7, 9 and 18.

The NMOS transistor 1115 may be formed in a separate PWELL process. The p-well voltage V-PWELL may be trimmed from 0V to (VDD+VTN).

Figure 12:
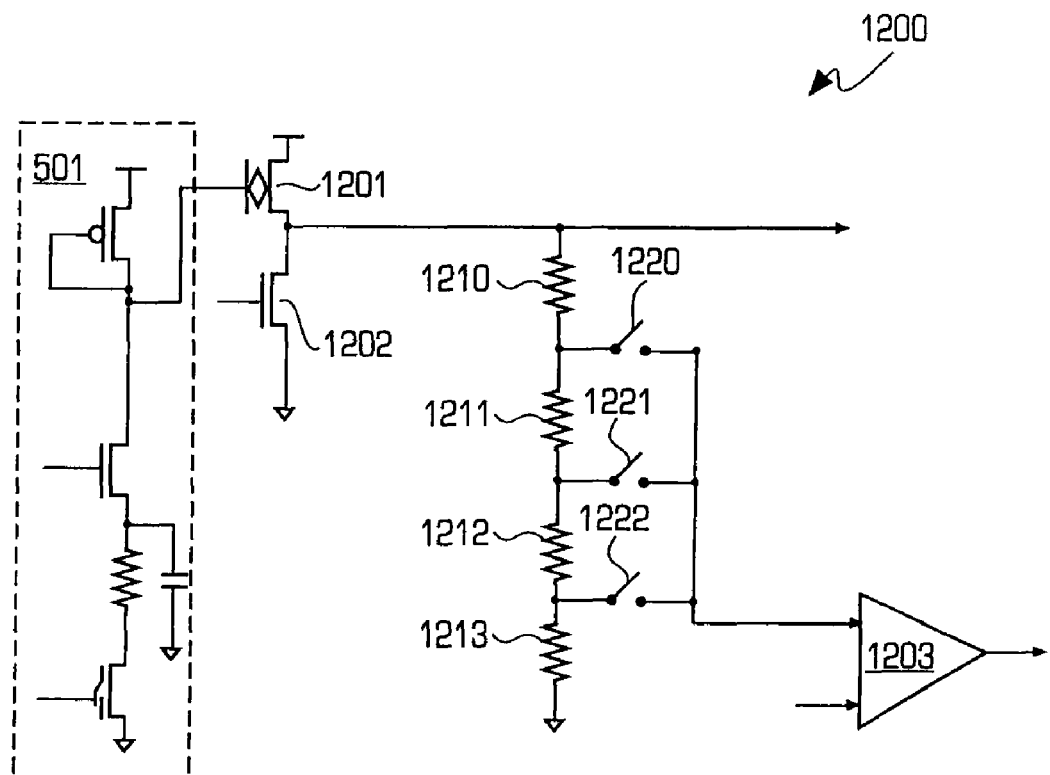
FIG. 12 is a schematic diagram illustrating a seventh embodiment of a sensing system of the digital multilevel bit memory system of FIG. 1.

FIG. 12 is a schematic diagram illustrating a sensing system 1200.

The sensing system 1200 comprises a reference column 501, a NLZ NMOS transistor 1201, an NMOS transistor 1202, a comparator 1203, a plurality of resistors 1210, 1211, 1212, and 1213 and a plurality of switches 1220, 1221, and 1222. The NMOS transistors 1201 and 1202 provide a buffer stage for the reference column 501. The resistors 1210 through 1213 are coupled in series between the source of the NMOS transistor 1201 and ground as a voltage divider. The switches 1220, 1221 and 1222 selectively couple nodes of the voltage divider to an input of the comparator 1203 for sensing. The reference current is set equal to the data current. The reference level is then trimmed using the switches 1220 through 1222 until the comparator 1203 switches. In an illustrative embodiment, the reference current and the data current are approximately 20 microamps.

Figure 13:
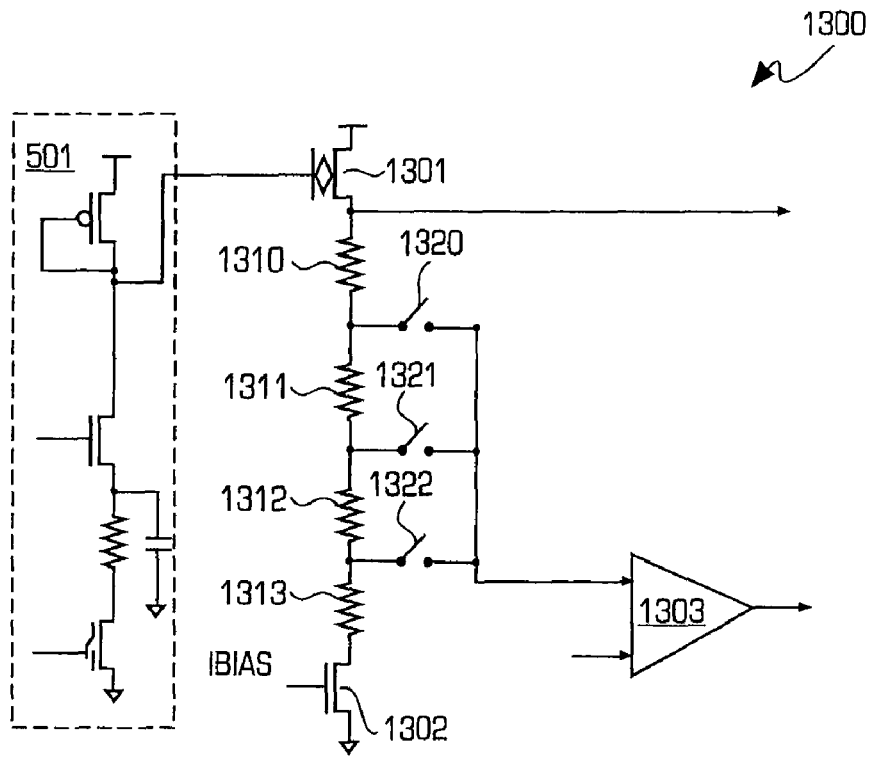
FIG. 13 is a schematic diagram illustrating an eighth embodiment of a sensing system of the digital multilevel bit memory system of FIG. 1.

FIG. 13 is a schematic diagram illustrating a sensing system 1300.

The sensing system 1300 comprises a reference column 501, an NLZ NMOS transistor 1301, an NMOS transistor 1302, a comparator 1303, a plurality of resistors 1310, 1311, 1312, and 1313, and a plurality of switches 1320, 1321, and 1322. The NMOS transistors 1301 and 1302 and the resistors 1310-1313 provide a buffer stage for the reference column 501. The resistors 1310-1313 are coupled in series between the source of the NMOS transistor 1301 and the drain of the NMOS transistor 1302 to form a voltage divider between the transistors 1301 and 1302. The switches 1320, 1321 and 1322 selectively couple nodes of the voltage divider to an input of the comparator 1303 for sensing. The reference current is set equal to the data current. The reference voltage is then trimmed using the switches 1320-1322 until the comparator 1303 switches. In an illustrative embodiment, the reference current and the data current are approximately 20 microamps.

Figure 14:
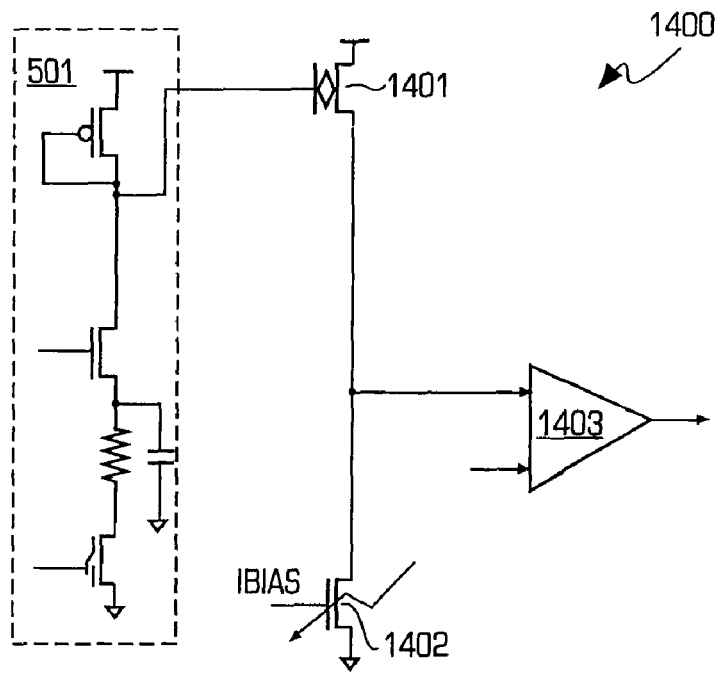
FIG. 14 is a schematic diagram illustrating a ninth embodiment of a sensing system of the digital multilevel bit memory system of FIG. 1.

FIG. 14 is a schematic diagram illustrating a sensing system 1400.

The sensing system 1400 comprises a reference column 501, an NLZ NMOS transistor 1401, a NMOS transistor 1402 and a comparator 1403. The transistors 1401 and 1402 are arranged as a buffer stage to buffer the output of the reference column 501. The bias of the NMOS transistor 1402 is adjusted until the comparator 1403 switches. In an illustrative embodiment, the reference current and the data current are approximately 20 microamps.

Figure 15:
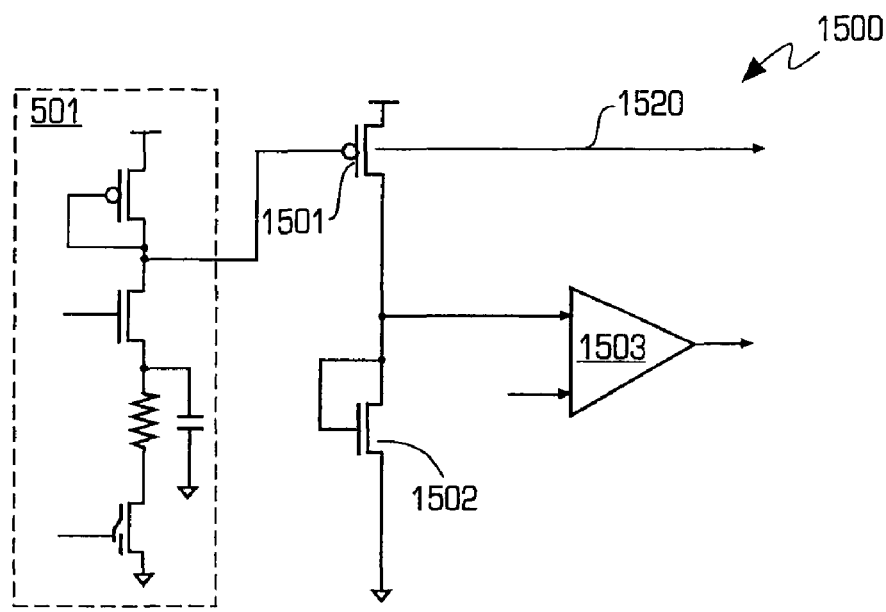
FIG. 15 is a schematic diagram illustrating a tenth embodiment of a sensing system of the digital multilevel bit memory system of FIG. 1.

FIG. 15 is a schematic diagram illustrating a sensing system 1500.

The sensing system 1500 comprises a reference column 501, a PMOS transistor 1501, a diode connected NMOS transistor 1502, and a comparator 1503. The PMOS transistor 1501 and the NMOS transistor 1502 provide a buffer stage for the reference column 501. The bulk of the PMOS transistor 1501 is biased by an adjustable voltage applied to the bulk terminal 1520, which may be at a voltage that is different or less than the sense amplifier supply voltage. The bulk voltage may be provided by a voltage source, such as described above in conjunction with FIGS. 6-7.

Figure 16:
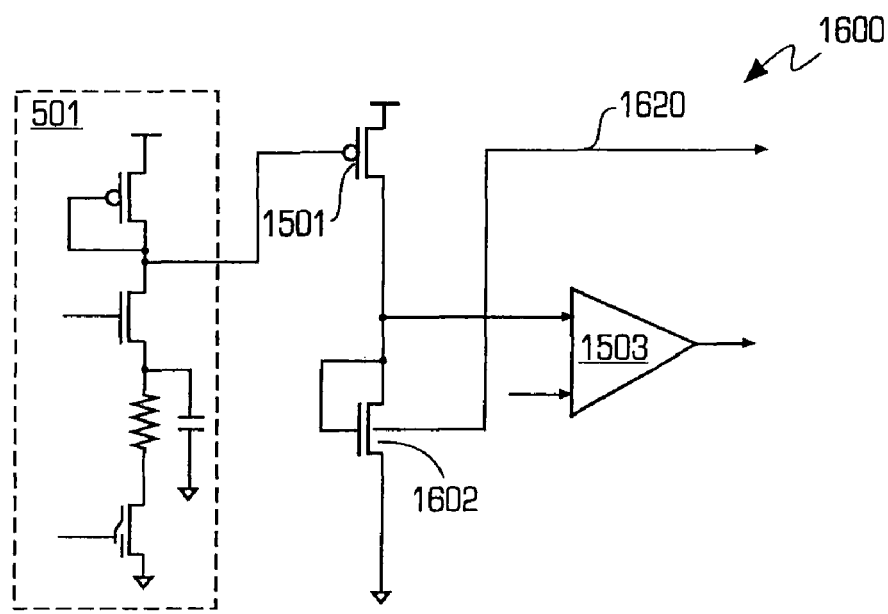
FIG. 16 is a schematic diagram illustrating an eleventh embodiment of a sensing system of the digital multilevel bit memory system of FIG. 1.

FIG. 16 is a schematic diagram illustrating a sensing system 1600.

The sensing system 1600 comprises a reference column 501, a PMOS transistor 1501, an NMOS transistor 1602, and a comparator 1503. The bulk of the diode connected NMOS transistor 1602 is biased by an adjustable voltage applied to a bulk terminal 1620, which may be at a voltage that is different or less than the sense amplifier supply voltage. A NMOS transistor 1602 may be formed using a triple well process, and the PWELL is isolated from the p substrate. The bulk voltage may be provided by a voltage source, such as described above in conjunction with FIGS. 6-7.

Figure 17:
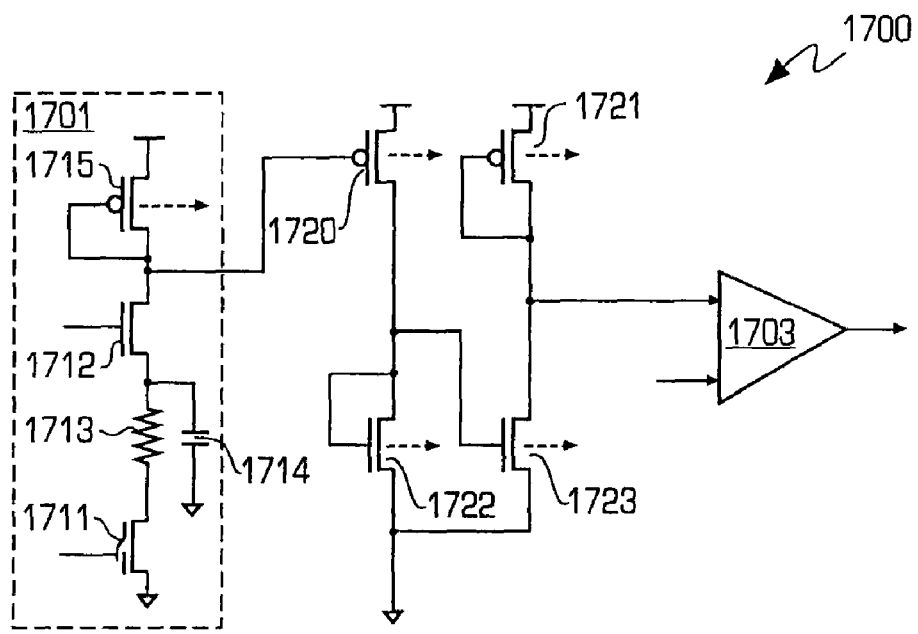
FIG. 17 is a schematic diagram illustrating a twelfth embodiment of a sensing system of the digital multilevel bit memory system of FIG. 1.

FIG. 17 is a schematic diagram illustrating a sensing system 1700.

The sensing system 1700 comprises a reference column 1701, a plurality of PMOS transistors 1720 and 1721, a plurality of NMOS transistors 1722 and 1723, and a comparator 1703. The reference column 1701 comprises a reference memory cell 1711, an enable switch 1712, and a diode connected PMOS transistor 1715. The PMOS transistors 1720 and 1721 and the NMOS transistors 1722 and 1723 provide a two stage gain stage for the reference column 1701. The NMOS transistors 1722 and 1723 may be formed using a triple well process, and the PWELL is isolated from the p substrate. The bulk of the PMOS transistors 1715, 1720, and 1721 are biased by an adjustable voltage applied to a corresponding bulk terminal, which may be at a voltage that is different or less than the sense amplifier supply voltage. The bulk voltage may be provided by a voltage source which is described above in conjunction with FIGS. 6-7. The bulk of the NMOS transistors 1722 and 1723 may be biased by an adjustable voltage applied to a corresponding bulk terminal, which may be at a voltage that is different or less than the sense amplifier supply voltage. The bulk voltage may be provided by a voltage source such as described below in conjunction with FIG. 18.

Figure 18:
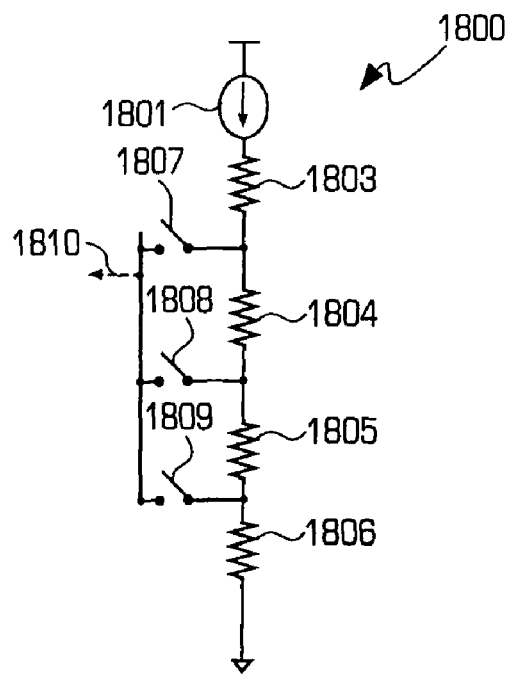
FIG. 18 is a schematic diagram illustrating a fourth embodiment of a bulk voltage generator of a sensing system of the digital multilevel bit memory system of FIG. 1.

FIG. 18 is a schematic diagram illustrating a bulk voltage generator 1800.

The bulk voltage generator 1800 comprises a current source 1801, a plurality of resistors 1803-1806, and a plurality of switches 1807-1809. A current source 1801 and the resistors 1803-1806 are coupled in series between a supply voltage VDD and ground. Although four resistors are shown in FIG. 18, other numbers of resistors may be used. The current source 1801 generates a fixed current for the voltage divider. The plurality of switches 1807, 1808, and 1809 selectively couple nodes between the resistors 1803, 1804, 1805, 1806, which are arranged as a voltage divider, to an output node 1810. The output node 1810 may be coupled to the bulk terminal of the NMOS transistors 1722 and 1723 (FIG. 17).

Figure 19:
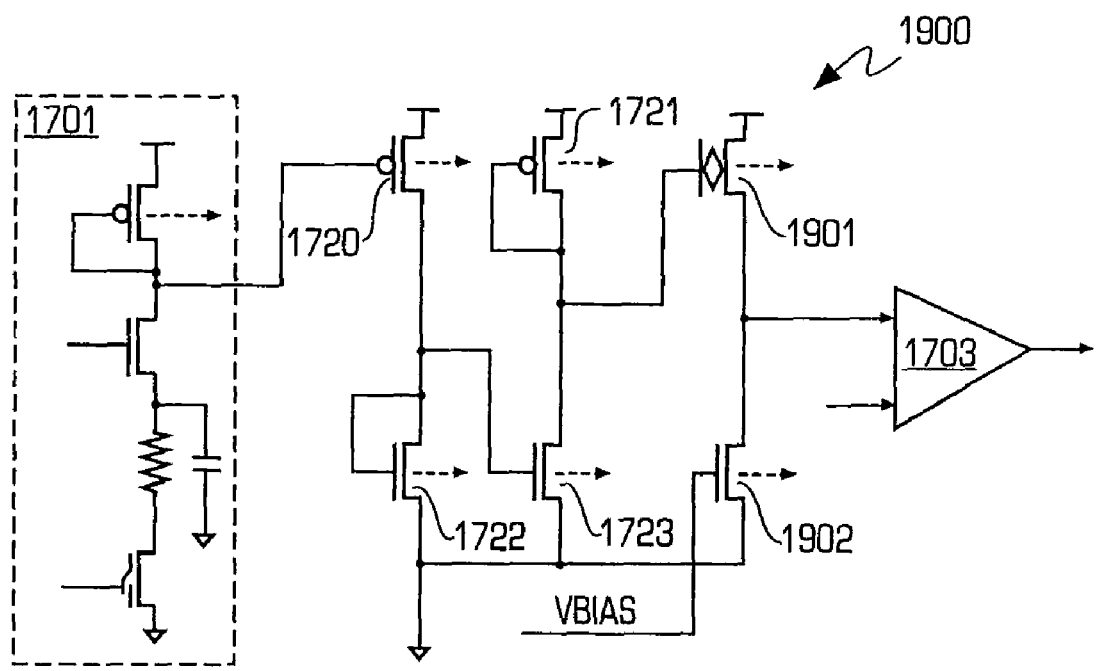
FIG. 19 is a schematic diagram illustrating a thirteenth embodiment of a sensing system of the digital multilevel bit memory system of FIG. 1.

FIG. 19 is a schematic diagram illustrating a sensing system 1900.

The sensing system 1900 comprises a reference column 1701, a plurality of PMOS transistors 1720 and 1721 and a plurality of NMOS transistors 1722 and 1723 that are arranged in a manner similar to the sensing system 1700 (FIG. 17). The sensing system 1900 further comprises an NLZ NMOS transistor 1901 and an NMOS transistor 1902 arranged as a third buffer stage. The sensing system 1900 further comprises a comparator 1703 coupled to the source of the NLZ NMOS transistor 1901. The bulk of the NMOS transistors 1901 and 1902 may be biased by an adjustable voltage applied to the bulk terminals. The NMOS transistors 1722, 1723, and 1902 may be formed using a triple well process, and the PWELL is isolated from the p substrate.

Figure 20:
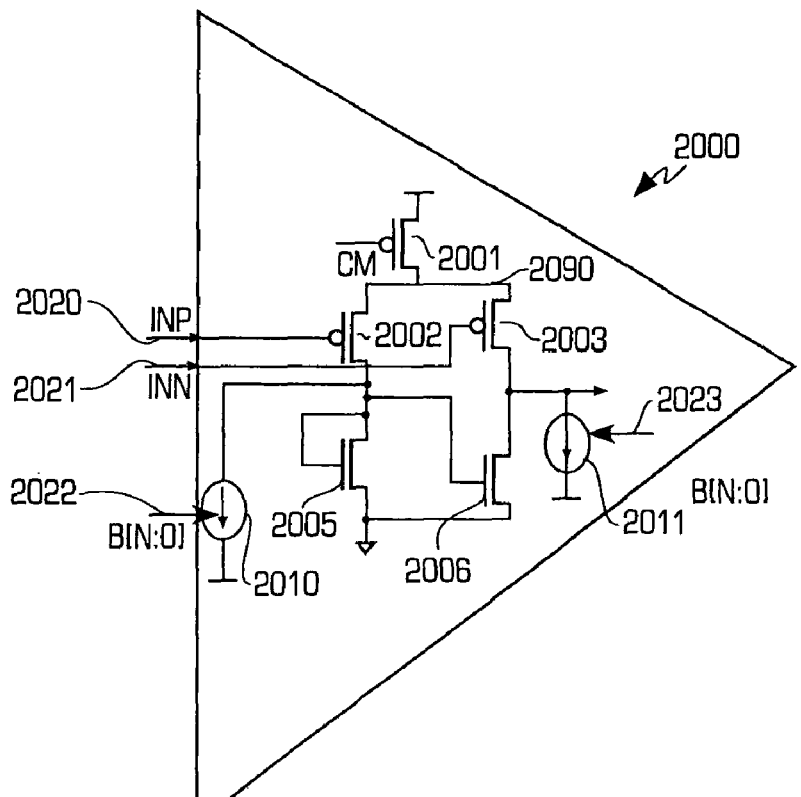
FIG. 20 is a schematic diagram illustrating a first embodiment of a differential amplifier of a sensing system of the digital multilevel bit memory system of FIG. 1.

FIG. 20 is a schematic diagram illustrating a differential amplifier 2000.

The differential amplifiers described herein may be implemented into operational amplifiers. The differential amplifier 2000 comprises a plurality of PMOS transistors 2001, 2002, and 2003, a plurality of NMOS transistors 2005 and 2006, and a plurality of current sources 2010 and 2011. The current sources 2010 and 2011 are digitally programmable. The PMOS transistors 2001, 2002, and 2003 and the NMOS transistors 2005 and 2006 are arranged as a differential amplifier in response to input signals 2020 and 2021 applied to the gates of the PMOS transistors 2002 and 2003, respectively. The current sources 2010 and 2011 are coupled in parallel with the drain-source terminals of the NMOS transistors 2005 and 2006, respectively. The current sources 2010 and 2011 generate digital-to-analog conversion currents in response to digital selection signals 2022 and 2023, respectively. The current sources 2010 and 2011 provide an offset current to compensate for the offset of the differential amplifier 2000. An n-well voltage generator 2100 (see FIG. 21) may be used for the bulk of the PMOS transistors 2001 through 2003. The MOS transistors 2005 and 2006 may be formed using a triple well process, and the PWELL is isolated from the p substrate and its voltage can be trimmed. A common mode node 2090 may be used to determine the bulk voltage.

In illustrative embodiments of FIG. 20 and FIGS. 22-26, described below, the bulk voltage VBS may be used to change the threshold voltage VT, for example, at a rate dVT/dVBS=0.1V/0.2V. The dVT Range may be approximately 0.3V for a pn junction voltage V-pn of 0.6V.

Figure 21:
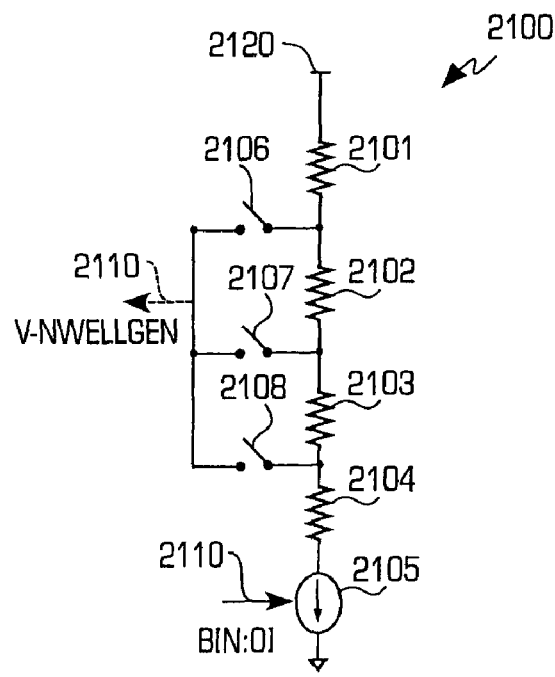
FIG. 21 is a schematic diagram illustrating a fifth embodiment of a bulk voltage generator of a sensing system of the digital multilevel bit memory system of FIG. 1.

FIG. 21 is a schematic diagram illustrating a bulk voltage generator 2100.

The bulk voltage generator 2100 comprises a plurality of resistors 2101, 2102, 2103, and 2104 and a current source 2105 coupled in series between a node 2120 and ground. The node 2120 may be coupled to the node 2090 (FIG. 20). Although four resistors are shown in FIG. 21, other numbers of resistors may be used. The bulk voltage generator 2100 further comprises a plurality of switches 2106, 2107, 2108, which selectively couple nodes between the resistors 2101, 2102, 2103, and 2104, to an output node 2110. The output node 2110 may be coupled to the bulk of the NMOS transistors 2005 and 2006 (FIG. 20). The node 2110 may be coupled to the drain of the PMOS transistor 2001 (FIG. 20). The current source 2105 generates a digital-to-analog conversion current in response to a digital selection signal 2111.

Figure 22:
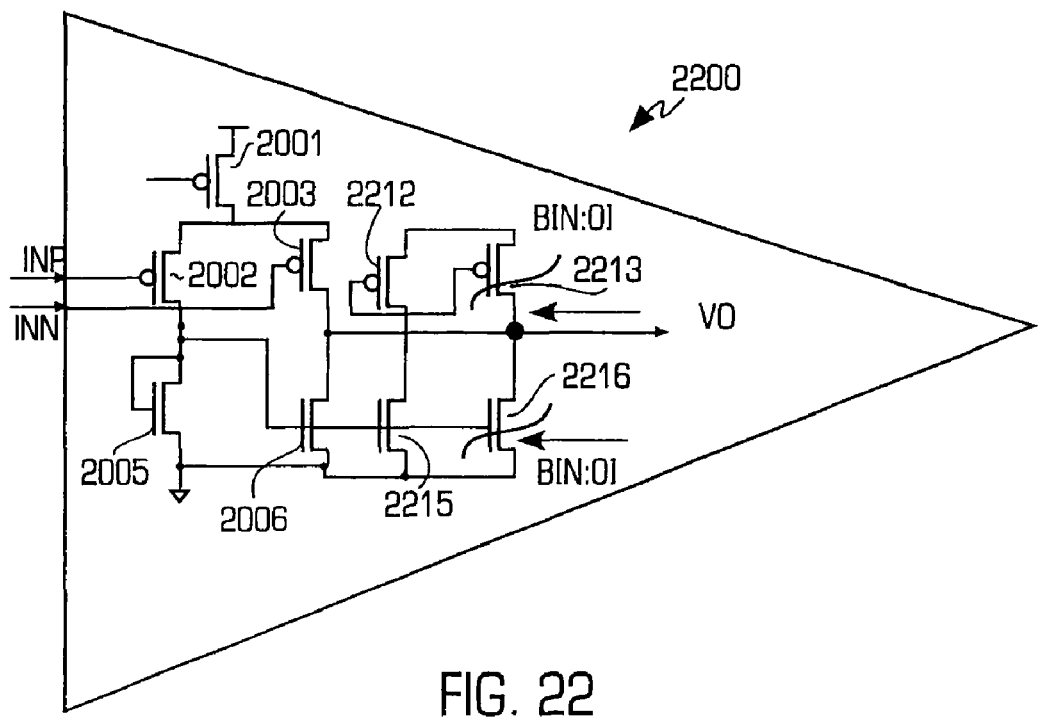
FIG. 22 is a schematic diagram illustrating a second embodiment of a differential amplifier of a sensing system of the digital multilevel bit memory system of FIG. 1.

FIG. 22 is a schematic diagram illustrating a differential amplifier 2200.

The differential amplifier 2200 comprises a plurality of PMOS transistors 2001, 2002 and 2003 and a plurality of NMOS transistors 2005 and 2006 arranged in a similar manner as in the differential amplifier 2000 (FIG. 20), and further includes a buffer stage comprising a plurality of PMOS transistors 2212 and 2213 and a plurality of NMOS transistors 2215 and 2216. The MOS transistors 2213 and 2216 are selectable (or trimmable) by digital control bits to adjust for offset. The bulk of the MOS transistor 2213 and the NMOS transistor 2216 may be coupled to the bulk voltage generator 2100 (FIG. 21). The MOS transistors 2215, 2216, 2005 and 2006 may be formed using a triple well process, and the PWELL is isolated from the p substrate.

Figure 23:
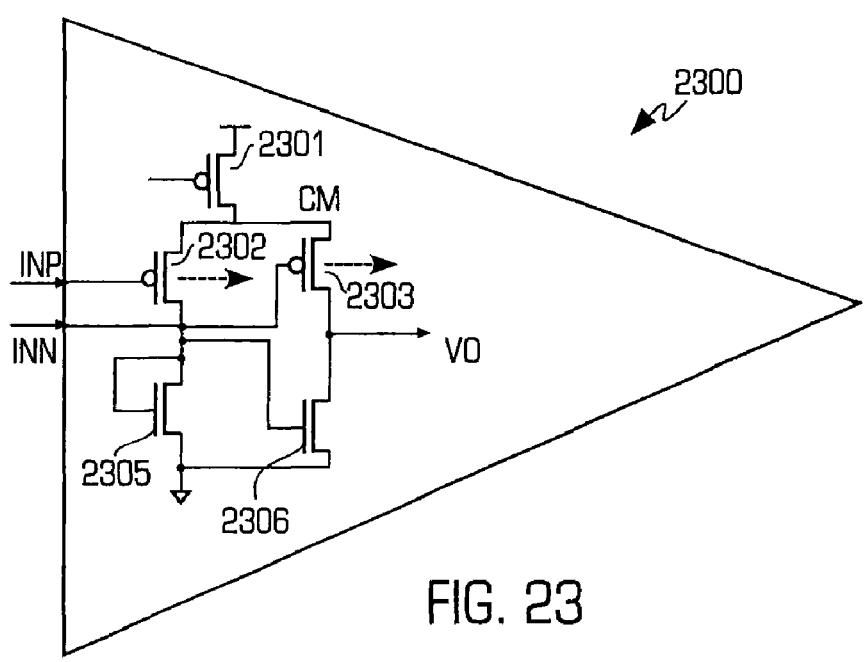
FIG. 23 is a schematic diagram illustrating a third embodiment of a differential amplifier of a sensing system of the digital multilevel bit memory system of FIG. 1.

FIG. 23 is a schematic diagram illustrating a differential amplifier 2300.

The differential amplifier 2300 comprises a plurality of PMOS transistors 2301, 2302, and 2303, and a plurality of NMOS transistors 2305 and 2306 arranged in a similar manner as the differential amplifier 2000 (FIG. 20). The bulk of the PMOS transistors 2302 and 2303 are coupled to a bulk voltage generator 2100 (FIG. 21), which is coupled between the common mode node formed of the sources of the PMOS transistors 2302 and 2303 and ground. The MOS transistors 2305 and 2306 may be formed using a triple well process, and the PWELL is isolated from the p substrate.

Figure 24:
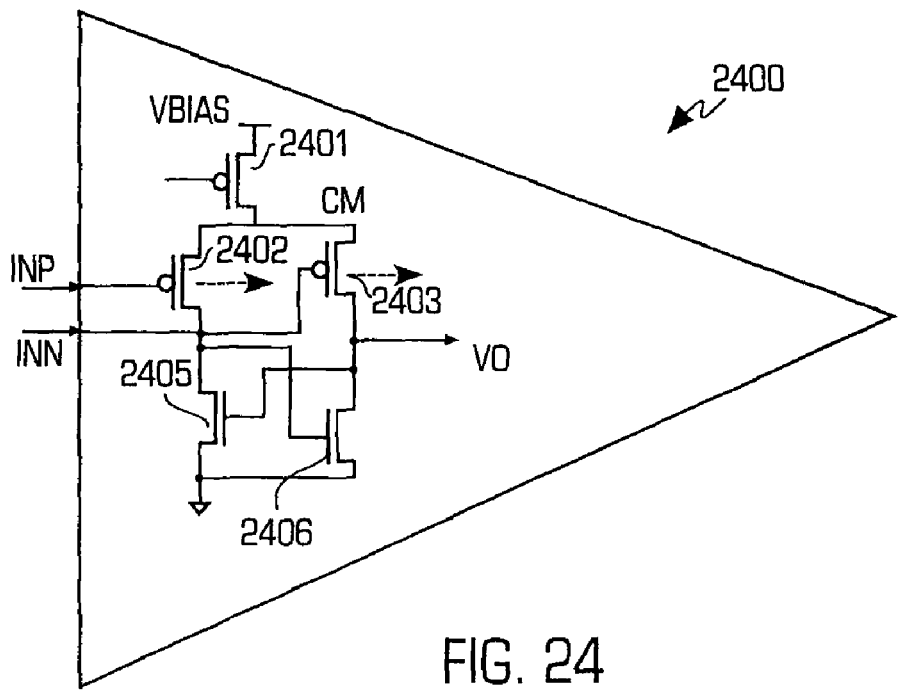
FIG. 24 is a schematic diagram illustrating a fourth embodiment of a differential amplifier of a sensing system of the digital multilevel bit memory system of FIG. 1.

FIG. 24 is a schematic diagram illustrating a differential amplifier 2400.

The differential amplifier 2400 comprises a plurality of PMOS transistors 2401, 2402 and 2403, and a plurality of NMOS transistors 2405 and 2406. The NMOS transistors 2405 and 2406 are cross-coupled so that the gates of the transistors 2405 and 2406 are biased by the drain of the PMOS transistors 2403 and 2402, respectively. The PMOS transistors 2402 and 2403 include a bulk that is biased by the bulk voltage generator 2100 (FIG. 21) that is coupled between the common mode node formed of the sources of the PMOS transistors 2402 and 2403 and ground. The transistors 2405 and 2406 may be formed using a triple well process, and the PWELL is isolated from the p substrate.

Figure 25:
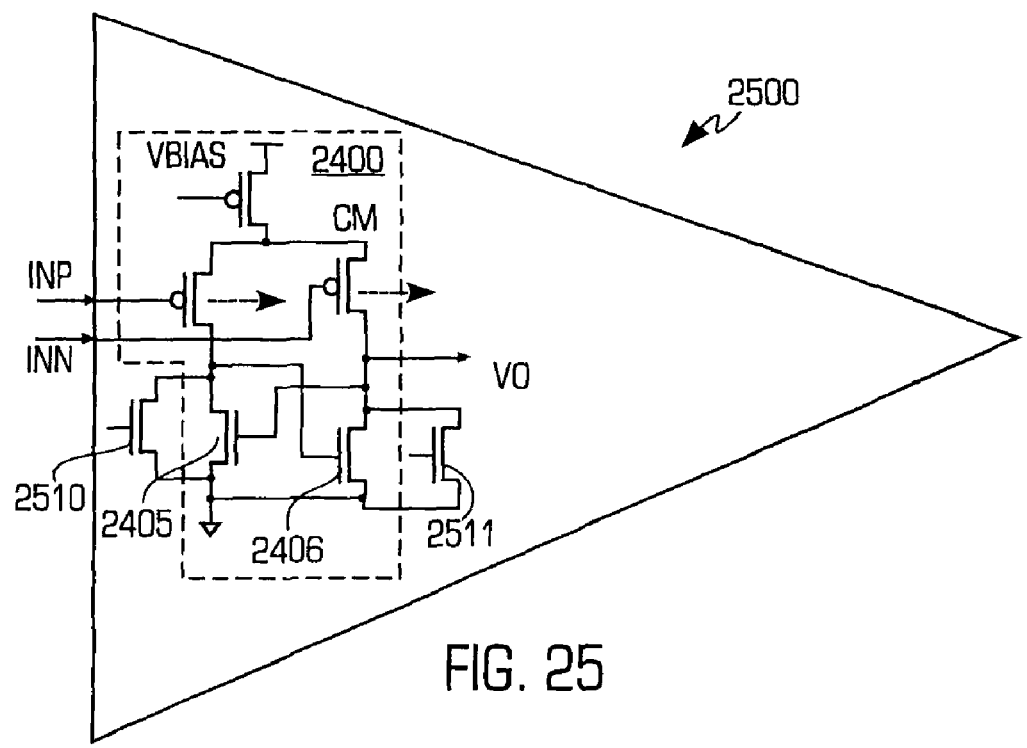
FIG. 25 is a schematic diagram illustrating a fifth embodiment of a differential amplifier of a sensing system of the digital multilevel bit memory system of FIG. 1.

FIG. 25 is a schematic diagram illustrating a differential amplifier 2500.

The differential amplifier 2500 comprises a differential amplifier 2400 (FIG. 24) and a plurality of NMOS transistors 2510 and 2511. The NMOS transistors 2510 and 2511 provide current bias and are coupled in parallel with the drain-source terminals of the NMOS transistors 2405 and 2406, respectively.

Figure 26:
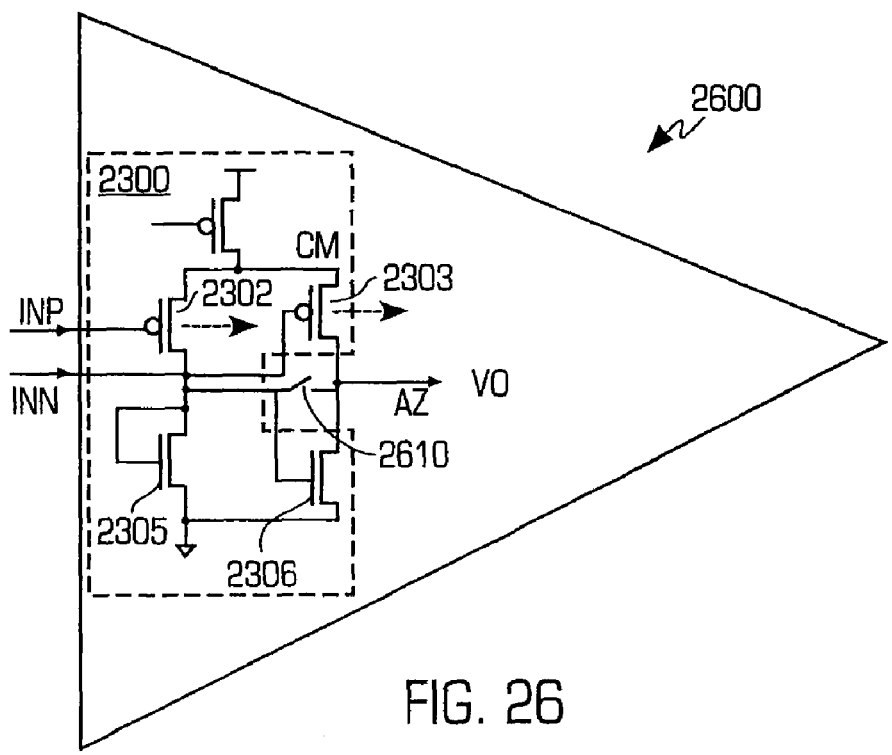
FIG. 26 is a schematic diagram illustrating a sixth embodiment of a differential amplifier of a sensing system of the digital multilevel bit memory system of FIG. 1.

FIG. 26 is a schematic diagram illustrating a differential amplifier 2600.

The differential amplifier 2600 comprises an differential amplifier 2300 (FIG. 23) and an autozero switch 1610. The autozero switch 2610 autozeroes the drains of the PMOS transistors 2302 and 2303 before activation of the differential amplifier 2300.

Figure 27:
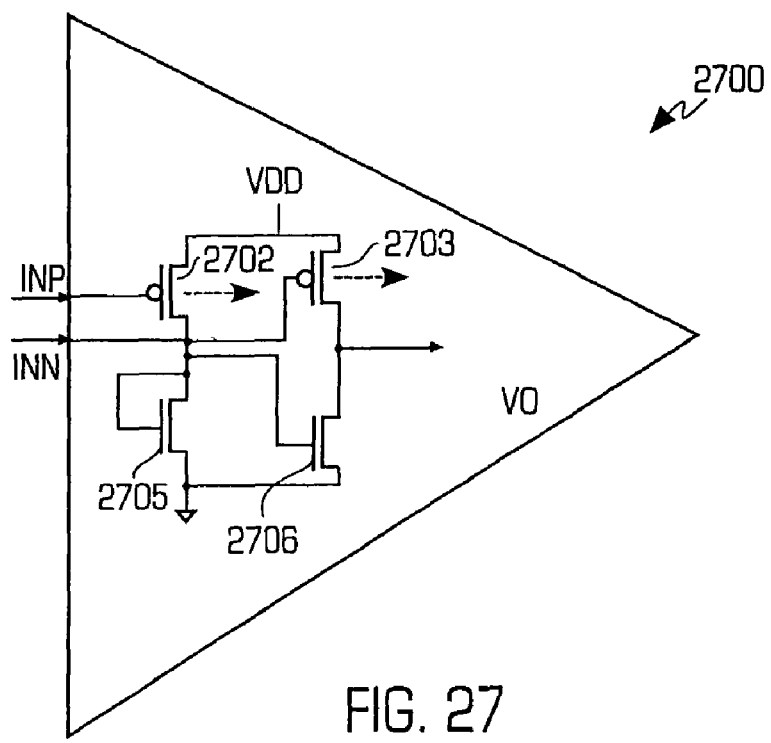
FIG. 27 is a schematic diagram illustrating a seventh embodiment of a differential amplifier of a sensing system of the digital multilevel bit memory system of FIG. 1.

FIG. 27 is a schematic diagram illustrating a differential amplifier 2700.

The differential amplifier 2700 comprises a plurality of PMOS transistors 2702 and 2703 and a plurality of NMOS transistors 2705 and 2706 that are arranged in a similar manner as the differential amplifier 2300 (FIG. 23), but the PMOS transistors 2702 and 2703 are coupled to the supply voltage VDD instead of a common mode node of a bias transistor. The bulk of the PMOS transistors 2702 and 2703 may be coupled to the bulk voltage generator 600 (FIG. 6). The voltage of the nwell is referenced to the supply voltage VDD.

Figure 28:
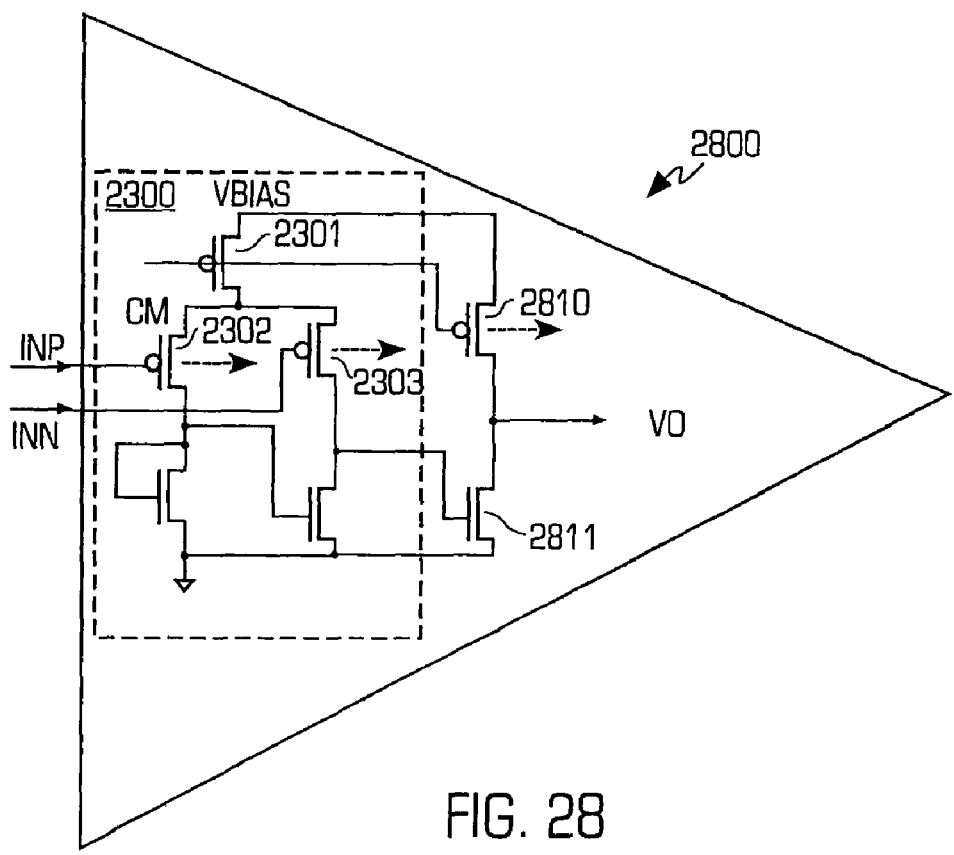
FIG. 28 is a schematic diagram illustrating an eighth embodiment of a differential amplifier of a sensing system of the digital multilevel bit memory system of FIG. 1.

FIG. 28 is a schematic diagram illustrating a differential amplifier 2800.

The differential amplifier 2800 comprises a differential amplifier 2300 (FIG. 23), a PMOS transistor 2810, and an NMOS transistor 2811. The transistors 2810 and 2811 are arranged as an output stage to the operational amplifier 2300. The PMOS transistors 2302 and 2303 of the differential amplifier 2300 include a bulk that is biased by the bulk voltage generator 2100 (FIG. 21), which is coupled between the common mode node formed of the drain of the PMOS transistors 2302 and 2303 and ground. The bulk of the PMOS transistor 2810 is biased by a voltage generator 600 (FIG. 6), which is referenced relative to the supply voltage VDD.

Figure 29:
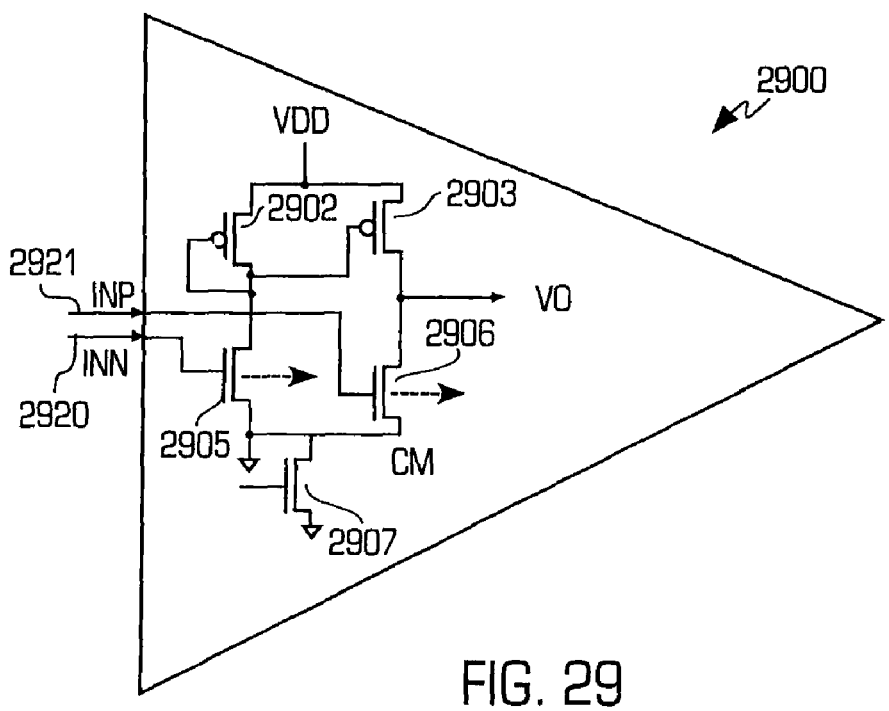
FIG. 29 is a schematic diagram illustrating a ninth embodiment of a differential amplifier of a sensing system of the digital multilevel bit memory system of FIG. 1.

FIG. 29 is a schematic diagram illustrating a differential amplifier 2900.

Figure 30:
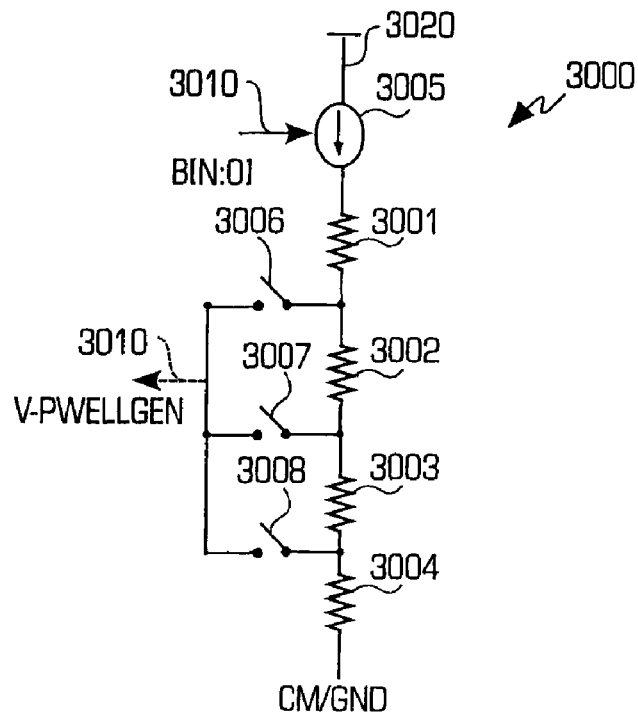
FIG. 30 is a schematic diagram illustrating a sixth embodiment of a bulk voltage generator of a sensing system of the digital multilevel bit memory system of FIG. 1.

The differential amplifier 2900 has an n-type differential pair. The operational amplifier 2900 comprises plurality of PMOS transistors 2902 and 2903 and a plurality of PMOS transistors 2905, 2906, and 2907 arranged as an differential amplifier. In response to input signals 2920 and 2921 applied to the gates of the NMOS transistors 2905 and 2906, respectively. The NMOS transistor 2907 provides bias to the differential amplifier 2900. The bulk of the NMOS transistors 2905 and 2906 may be coupled to a bulk voltage generator 3000 (FIG. 30). The voltage of an NWELL may be referenced to the supply voltage VDD.

FIG. 30 is a schematic diagram illustrating a bulk voltage generator 3000.

The voltage generator 3000 comprises a current source 3005 and a plurality of resistors 3001, 3002, 3003, and 3004 coupled in series between a supply voltage and a node 3020, which may be coupled to a common mode node 3020 or to ground. Although four resistors are shown in FIG. 30, other numbers of resistors may be used. The bulk voltage generator 3000 further comprises a plurality of switches 3006, 3007, 3008, which selectively couple nodes between the resistors 3001, 3002, 3003, 3004 to an output node 3010.

Figure 31:
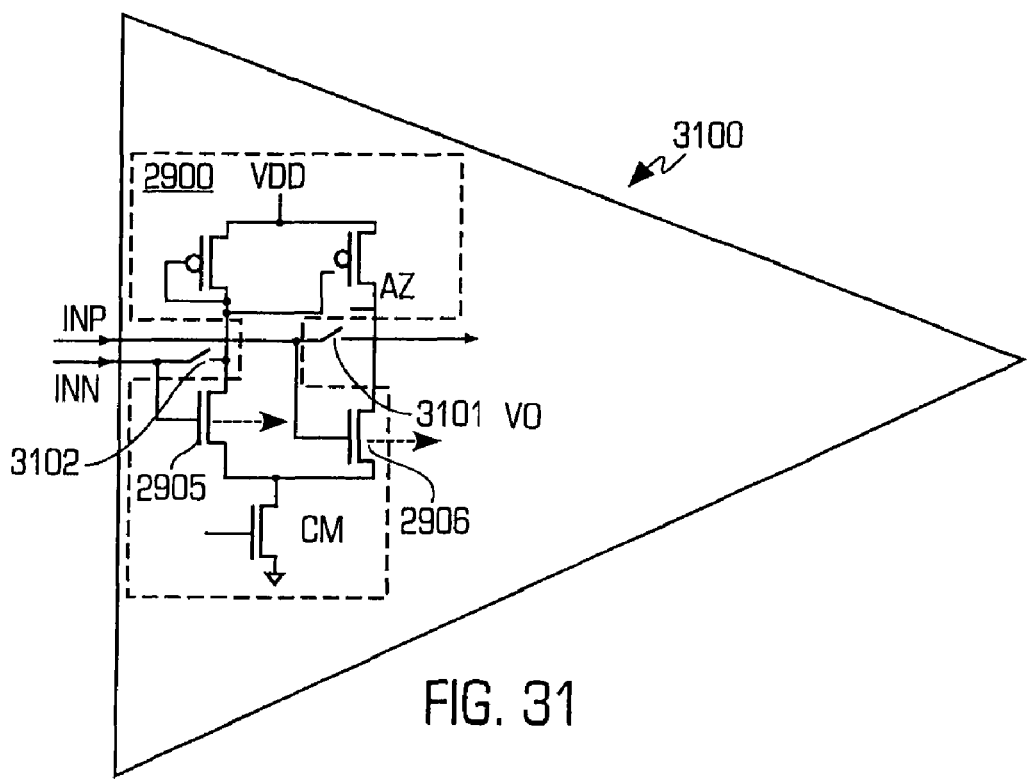
FIG. 31 is a schematic diagram illustrating a tenth embodiment of a differential amplifier of a sensing system of the digital multilevel bit memory system of FIG. 1.

FIG. 31 is a schematic diagram illustrating a differential amplifier 3100.

The differential amplifier 3100 comprises a differential amplifier 2900 (FIG. 29) and a plurality of autozero switches 3101 and 3102. The autozero switch 3101 autozeroes the drain and gate of the NMOS transistor 2906 before activation of the operational amplifier 2900. The autozero switch 3102 autozeroes the drain and gate of the NMOS transistor 2905 before activation of the differential amplifier 2900.

Figure 32:
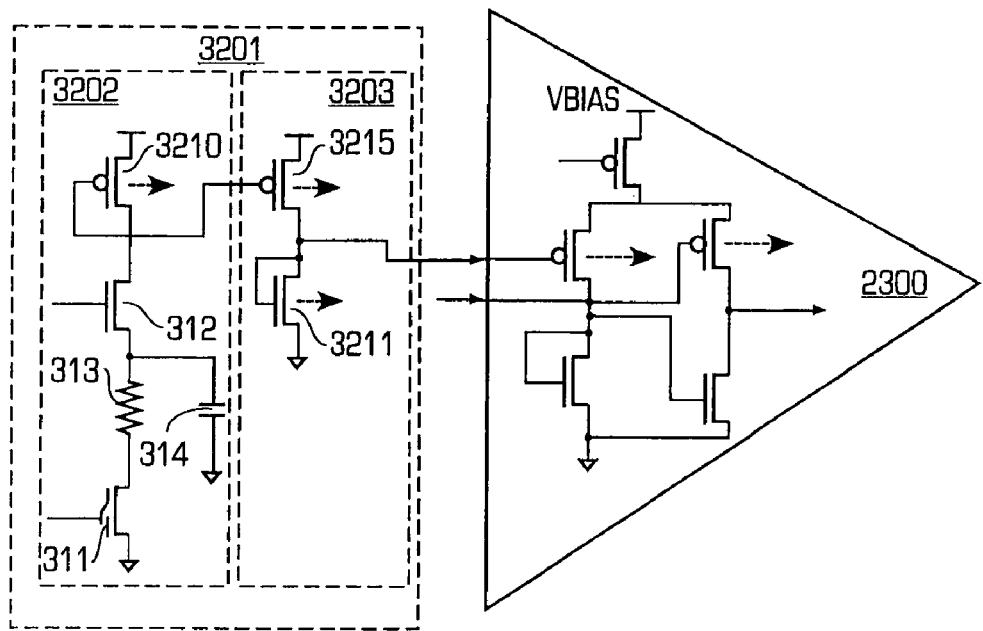
FIG. 32 is a schematic diagram illustrating a first embodiment of a memory cell sensing system of the digital multilevel bit memory system of FIG. 1.

FIG. 32 is a schematic diagram illustrating a memory cell sensing system 3200.

The memory cell sensing system 3200 comprises a differential amplifier 2300 (FIG. 23) and a sensing system 3201. The sensing system 3201 comprises a memory cell column 3202 and a sensing stage 3203. The memory column 3202 comprises a reference memory cell 311, an NMOS transistor 312 and a diode connected PMOS transistor 3215. A bitline resistor 313 is shown to indicate resistance on the bitline. A bitline capacitor 314 is shown to indicate capacitance on a bitline. The data column 3202 provides an output voltage to the sensing stage 3203 on the drain of the PMOS transistor 3215. The bulk of the PMOS transistor 3215 may be adjustable. The sensing stage 3203 comprises a PMOS transistor 3210 having a gate coupled to the drain of the PMOS transistor 3215, and further comprises a diode connected NMOS transistor 3211. The PMOS transistor 3210 and the NMOS transistor 3211 may include a bulk that is coupled to an adjustable voltage. The bulk of the transistors 3215, 3210, and 3211 may be coupled to a bulk voltage generator, such as the bulk voltage generator 1800 (FIG. 18).

In illustrative embodiments of FIG. 32 and FIGS. 33-34, described below, the bulk voltage VBS may be used to change the threshold voltage VT, for example, at a rate dVT/dVBS=0.1V/0.2V. The dVT Range may be approximately 0.3V for a pn junction voltage V-pn of 0.6V.

Figure 33:
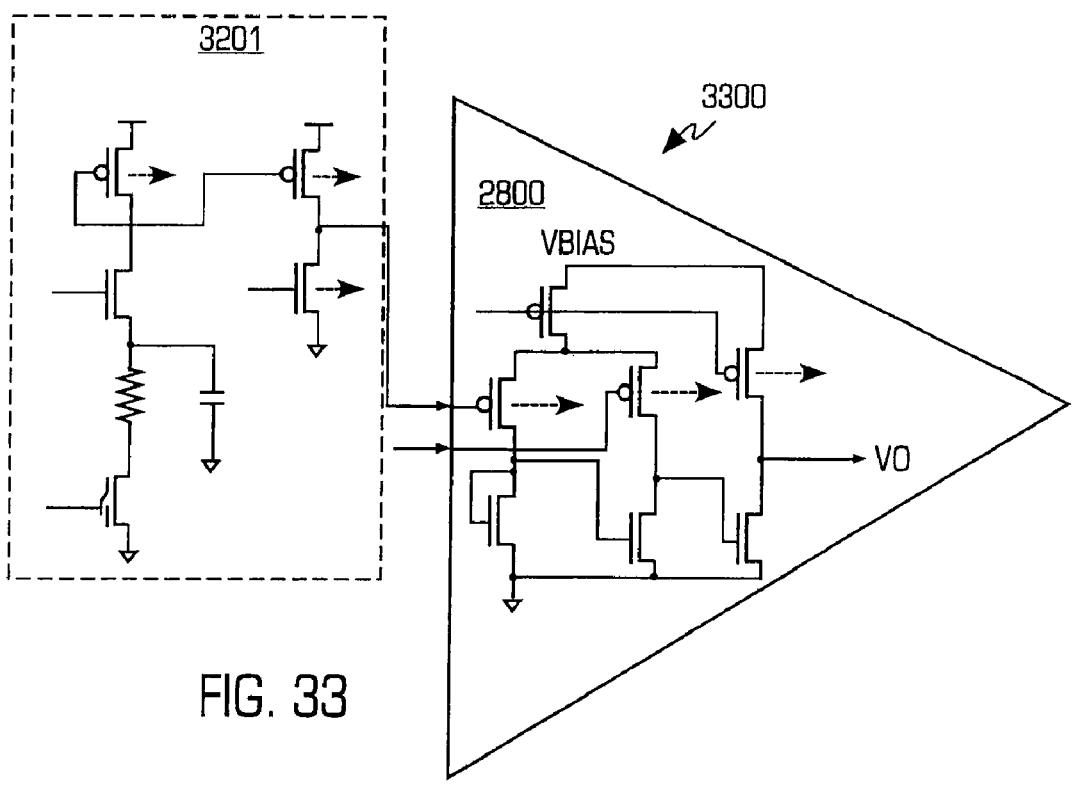
FIG. 33 is a schematic diagram illustrating a second embodiment of a memory cell sensing system of the digital multilevel bit memory system of FIG. 1.

FIG. 33 is a schematic diagram illustrating a memory cell sensing system 3300.

The memory cell sensing system 3300 comprises a sensing stage 3201 and an operational amplifier 2800.

Figure 34:
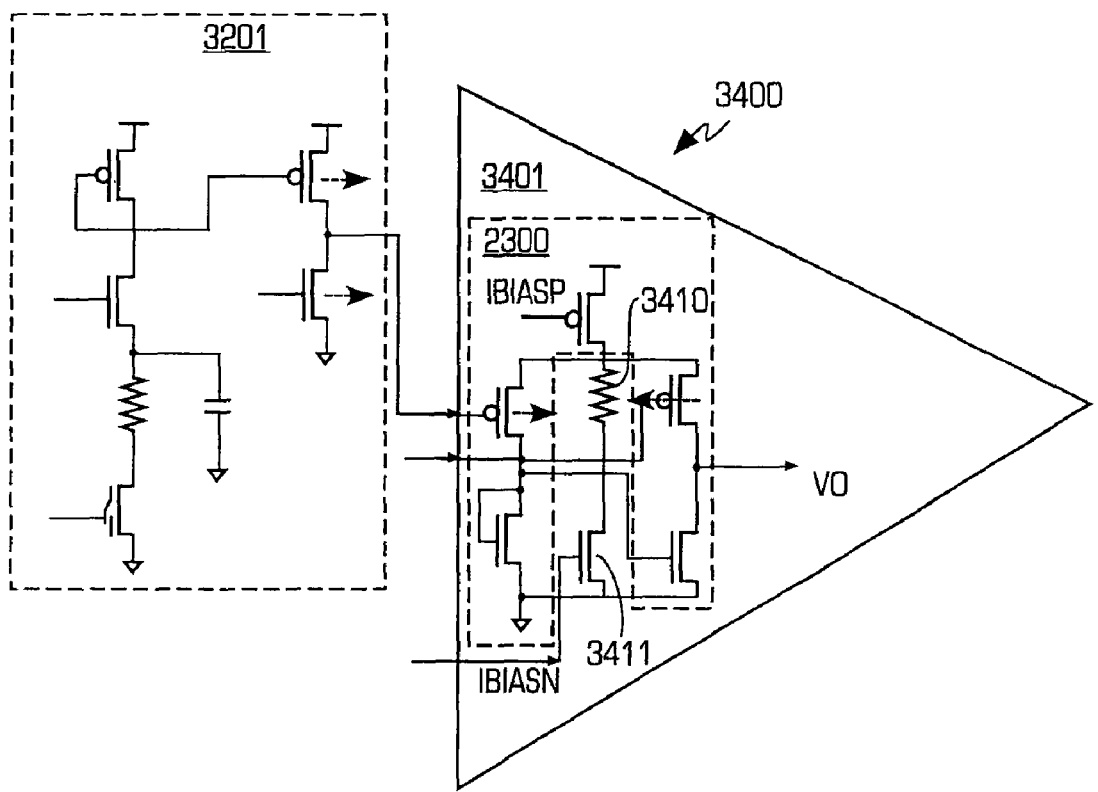
FIG. 34 is a schematic diagram illustrating a third embodiment of a memory cell sensing system of the digital multilevel bit memory system of FIG. 1.

FIG. 34 is a schematic diagram illustrating a memory cell sensing system 3400.

The memory cell sensing system 3400 comprises a sensing stage 3201 and a differential amplifier 3401. The differential amplifier 3401 comprises a differential amplifier 2300 (FIG. 23), a resistor 3410, and an NMOS transistor 3411. The resistor 3410 and the drain-source terminals of the NMOS transistor 3411 are coupled between the common mode node of the differential amplifier 2300 and ground to adjust the voltage on the common mode node and to adjust the bulk voltage of the PMOS transistors 2302 and 2303 of the differential amplifier 2300. The resistor 3410 may be used to tap a divided voltage for application to the bulk of the PMOS transistors 2302 and 2303. In an alternative embodiment, the bias current on the gate of the NMOS transistor 3411 may be modulated to adjust the tap voltage.

Figure 35:
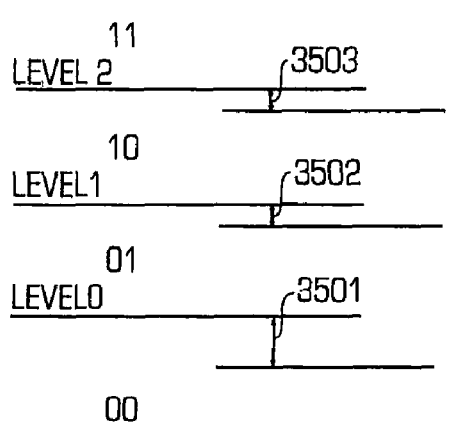
FIG. 35 is a diagram illustrating voltages for memory levels of the digital multilevel bit memory system of FIG. 1.

FIG. 35 is a diagram illustrating voltages for memory levels.

As an illustrative embodiment, a two-bit memory cell system is described. The voltage levels, Level 0, Level 1, and Level 2, are used to divide the voltage range into two-bit data 00, 01, 10, and 11. At low levels, the speed of sensing slows down which implies that an offset addition may be used to speed up the differential amp timing. As shown in FIG. 35, Level 0 has an offset 3501 that is greater than the offset 3502 for Level 1 and 3503 for Level 2. The offset addition may be applied at the differential amplifier or the load to compensate for the offset at a pull up load for a differential amplifier or other systematic offset, for example, from supply voltage VDD variation, interconnect mismatch, current dependent speed mismatch, or decoding path mismatch. The offset may be created by a combination, such as width/length trimming of transistors, or well modulation. Different offset range may be used for different levels. The offset may be used as a margin check for each level.

Figure 36:
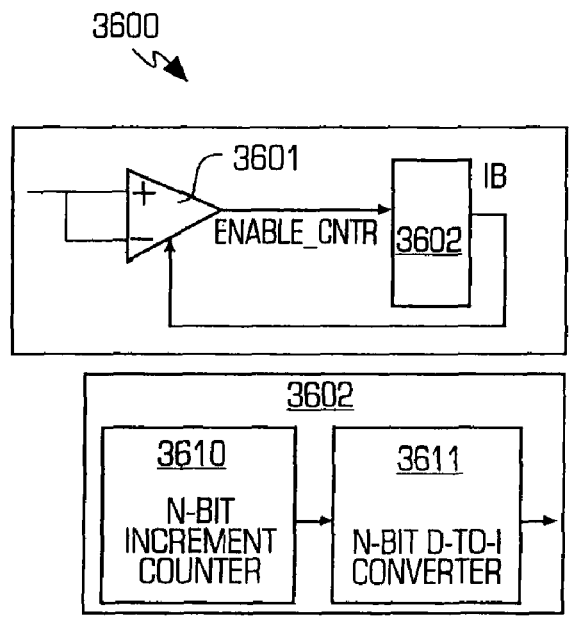
FIG. 36 is a block diagram illustrating a digital autozero control system of the digital multilevel bit memory system of FIG. 1.

FIG. 36 is a block diagram illustrating a digital autozero control system 3600.

The autozero control system 3600 comprises a comparator 3601 and a control circuit 3602. The comparator 3601 may be, for example, one of the differential amplifiers described above. The control circuit 3602 provides a bias current in response to the output of the comparator 3601. The control circuit 3602 comprises an N-bit increment counter 3610 and an N-bit digital to current converter 3611. The well voltage is started with a low offset and gradually increased as the N-bit increment counter 3610 counts until the comparator 3601 switches. The corresponding parameters, such as the count in the counter 3610, are stored in volatile or nonvolatile memory.

Figure 37:
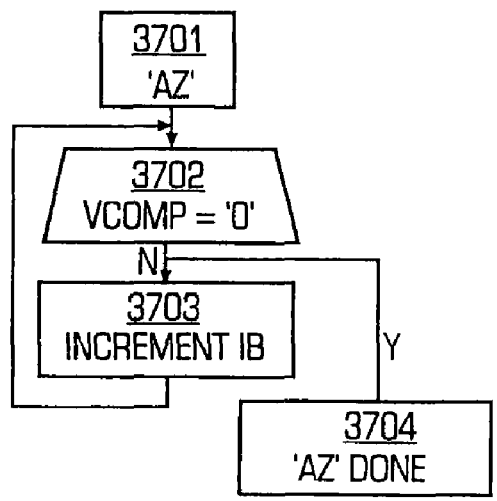
FIG. 37 is a flow chart illustrating the operation of the control system of FIG. 36.

FIG. 37 is a flowchart illustrating the operation of the control system 3600.

At autozero operation is commenced (block 3701). The voltage compensation is compared to zero and if it is zero, the autozero is completed (3704). Otherwise, the current IV is incremented (block 3703) and the voltage compensation is again analyzed (3702).

Figure 38:
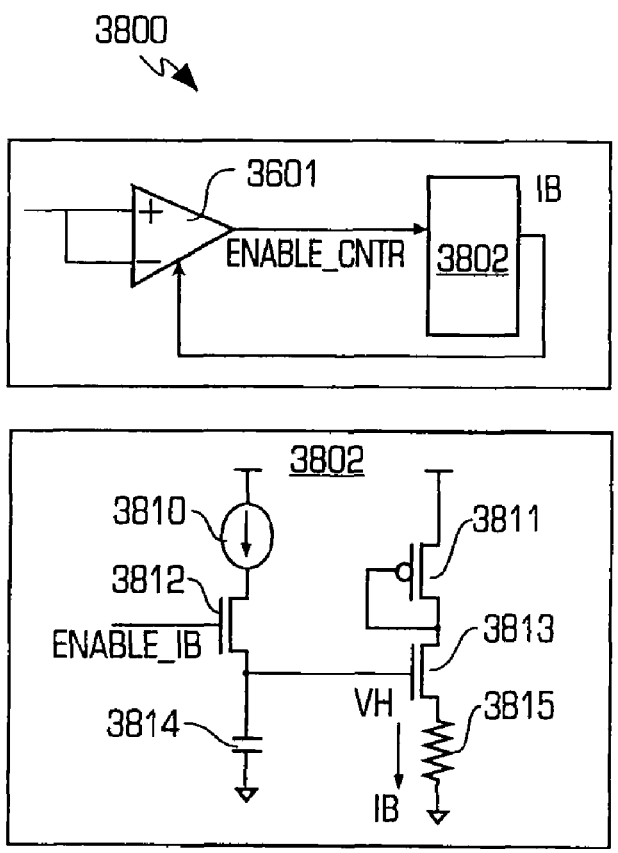
FIG. 38 is a block diagram illustrating an analog autozero control system of the digital multilevel bit memory system of FIG. 1.

FIG. 38 is a flowchart illustrating an analog control system 3800.

The control system 3800 comprises a comparator 3601 and a control circuit 3802. The control circuit 3802 is an analog circuit. The control system 3800 operates in a similar manner as the control system 3600, but the block 3703 of FIG. 31 is an increasing bias current instead of an incremented bias current. The control circuit 3802 operates as a voltage to current converter. The control circuit 3802 comprises a current source 3810, a PMOS transistor 3811, a plurality of NMOS transistors 3812 and 3813, a capacitor 3814, and a resistor 3815. The output of the comparator 3601 is applied to the gate of the NMOS transistor 3812 which controls the charging of the capacitor 3814, and generates a voltage VH to bias the gate of the NMOS transistor 3813. The diode connected PMOS transistor 3811 generates a bias current IB that controls the comparator 3601. The voltage of the VWELL is started from a low offset and gradually increased until the comparator 3601 switches to shut off the voltage to current conversion of the control circuit 3802. The analog voltage VH is stored either as volatile or non-volatile.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A differential amplifier comprising:
 an output transconductance amplifier comprising:
 a first PMOS transistor including first and second terminals spaced apart with a channel therebetween and including a gate for controlling current in said channel, said first terminal being coupled to a first voltage terminal, said gate being coupled to receive a bias voltage;
 a second PMOS transistor including first and second terminals spaced apart with a channel therebetween, including a gate for controlling current in said channel, and including a bulk voltage terminal, said gate being coupled to a first input terminal, said first terminal being coupled to the second terminal of the first PMOS transistor, said bulk voltage terminal being coupled to a second voltage terminal to receive a voltage different than the voltage on the first voltage terminal;

a first NMOS transistor including first and second terminals spaced apart with a channel therebetween, and including a gate for controlling current in said channel, said second terminal being coupled to a ground terminal, said gate being coupled to said first terminal of the first NMOS transistor and said second terminal of said second PMOS transistor;

a third PMOS transistor including first and second terminals spaced apart with a channel therebetween, including a gate for controlling current in said channel, and including a bulk voltage terminal, said second terminal being coupled to a first output terminal, said gate being coupled to a second input terminal, said first terminal being coupled to the second terminal of the first PMOS transistor, said bulk voltage terminal being coupled to the second voltage terminal;

a second NMOS transistor including first and second terminals spaced apart with a channel therebetween, and including a gate for controlling current in said channel, said second terminal being coupled to the ground terminal, said gate being coupled to the first terminal of the first NMOS transistor, said first terminal of the second NMOS transistor being coupled to the first output terminal;

an output stage coupled to the first output terminal, wherein said output stage comprising:

a fourth PMOS transistor including first and second terminals spaced apart with a channel therebetween, including a gate for controlling current in said channel, and including a bulk voltage terminal, said second terminal being coupled to said gate, said first terminal being coupled to the first voltage terminal;

a third NMOS transistor including first and second terminals spaced apart with a channel therebetween, and including a gate for controlling current in said channel, said second terminal being coupled to the ground terminal, said gate being coupled to the second terminal of the second PMOS transistor, said first terminal being coupled to the second terminal of the fourth PMOS transistor;

a fifth PMOS transistor including first and second terminals spaced apart with a channel therebetween, including a gate for controlling current in said channel, and including a bulk voltage terminal to receive a first adjustable voltage, said second terminal being coupled to a second output terminal, said gate being coupled to the second terminal of the fourth PMOS transistor, said first terminal being coupled to the first voltage terminal; and a fourth NMOS transistor including first and second terminals spaced apart with a channel therebetween, including a gate for controlling current in said channel, and including a bulk voltage terminal to receive a second adjustable voltage, said second terminal being coupled to the ground terminal, said gate being coupled to the second terminal of the second PMOS transistor, said first terminal being coupled to the second terminal of the fifth PMOS transistor; and a bulk voltage generator coupled to at least one of said PMOS or NMOS transistors to generate a bulk voltage different than a supply voltage of the output transconductance amplifier.

2. The differential amplifier of claim 1 wherein the size of any of the fourth PMOS transistor, third NMOS transistor, fifth PMOS transistor or fourth NMOS transistor of the output stage can be trimmed.

3. The differential amplifier of claim 1 wherein the bulk voltage generator further comprises:

a current source, having a first terminal and a second terminal;

a plurality of resistors, each resistor having a first terminal and a second terminal;

said plurality of resistors and said current source are connected in series, and connected between a voltage node and ground; and a plurality of switches, each switch for selectively connecting one of said plurality of resistors to an output node for supplying the bulk voltage.

* * * * *